United States Patent [19]

Campbell, Jr. et al.

[11] Patent Number: 5,166,685

[45] Date of Patent: Nov. 24, 1992

[54] AUTOMATIC SELECTION OF EXTERNAL MULTIPLEXER CHANNELS BY AN A/D CONVERTER INTEGRATED CIRCUIT

[75] Inventors: Jules D. Campbell, Jr.; William D. Huston; William P. Laviolette, all of Austin, Tex.

[73] Assignee: Motorola, Inc., Schaumburg, Ill.

[21] Appl. No.: 850,256

[22] Filed: Mar. 12, 1992

Related U.S. Application Data

[63] Continuation of Ser. No. 577,249, Sep. 4, 1990, abandoned.

[51] Int. Cl.$^5$ .............................................. H03M 1/12
[52] U.S. Cl. ..................................... 341/141; 341/155
[58] Field of Search ........................ 341/122, 141, 155

[56] References Cited

U.S. PATENT DOCUMENTS

| | | | |
|---|---|---|---|
| 3,821,696 | 6/1974 | Harrell et al. | 341/141 |
| 4,264,898 | 4/1981 | Barman et al. | 341/141 |
| 4,338,665 | 7/1982 | Aono et al. | 341/141 |
| 4,381,498 | 4/1983 | Goodale | 341/141 |
| 4,618,848 | 10/1986 | Parfitt | 341/141 |
| 4,654,632 | 3/1987 | Yoshida et al. | 341/141 |
| 4,677,422 | 6/1987 | Naito | 341/122 |
| 4,816,996 | 3/1989 | Hill et al. | 364/200 |
| 4,933,676 | 6/1990 | Hauge et al. | 341/141 |
| 4,937,575 | 6/1990 | Kummer | 341/118 |
| 4,958,277 | 9/1990 | Hill et al. | 364/200 |

Primary Examiner—Marc Hoff
Attorney, Agent, or Firm—Robert L. King; Jonathan P. Meyer; Walter W. Nielsen

[57] ABSTRACT

An analog-to-digital conversion system module comprises a pin-limited A/D converter integrated circuit (I.C.) to which at least one multiplexer I.C. may be coupled and sampled.

In one embodiment, host system software involvement is minimized by providing a sequence of sample commands, implemented by a channel sequencer or a programmable control table comprising a plurality of conversion command words (CCW's). A set of CCW's defines a conversion sequence which may be initiated and performed with minimal host system software involvement, upon conclusion of which a result table storing the converted digital values may be read by an associated device, such as a CPU.

In one embodiment, some I/O pins of the A/D converter I.C. function either as analog inputs or address outputs to the external multiplexer, while other analog input pins alternatively function as single input channels or as combined channels from one or more external multiplexers. A software-loadable control register comprises a control field for a control word which determines the function of the programmable pins.

22 Claims, 14 Drawing Sheets

| SIGNAL NAME | MNEMONIC | IMB I/O |
| --- | --- | --- |
| SYSTEM CLOCK | ICLOCK | INPUT FROM IMB |
| MASTER RESET | IMSTRSTB | INPUT FROM IMB |
| SYSTEM RESET | ISYSRSTB | INPUT FROM IMB |
| FREEZE | IFREEZEB | INPUT FROM IMB |
| TEST | ITSTMODB | INPUT FROM IMB |
| INTERNAL PERIPHERAL SELECT | IIPCSB | INPUT FROM IMB |
| MODULE MAPPING | IMODMAP | INPUT FROM IMB |
| FUNCTION CODES | IFC[3:0] | INPUT FROM IMB |
| CYCLE START | ICYSB | INPUT FROM IMB |
| WRITE | IWRITEB | INPUT FROM IMB |
| ADDRESS BUS | IADDR[23:0] | INPUT FROM IMB |
| ADDRESS STROBE | IASB | INPUT FROM IMB |
| ADDRESS ACKNOWLEDGE | IAACKB | OUTPUT TO IMB |
| SIZE | ISIZ[1:0] | INPUT FROM IMB |
| DATA STROBE | IDSB | INPUT FROM IMB |
| DATA BUS | IDATA[15:0] | INPUT/OUTPUT FROM/TO IMB |
| DATA TRANSFER ACKNOWLEDGE | IDTACKB | OUTPUT TO IMB |
| BUS ERROR | IBERRB | OUTPUT TO IMB |
| INTERRUPT REQUEST LEVEL | IRQ[7:1] | OUTPUT TO IMB |
| INTERRUPT ARBITRATION | IARB[1:0] | INPUT/OUTPUT FROM/TO IMB |

*FIG. 4*

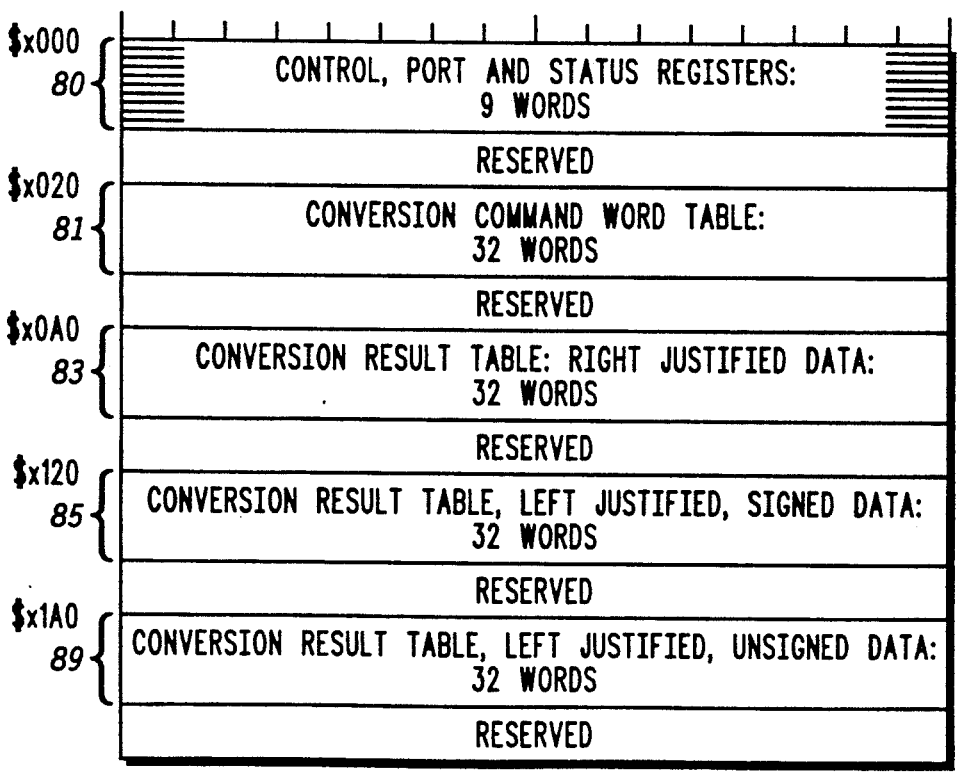

*FIG. 5*

NUMBER OF INTERNALLY + EXTERNALLY MUXED ANALOG CHANNELS

| TOTAL PINS AVAILABLE TO QADC MODULE | WITH NO EXTERNAL MUX CHIPS | WITH 1 EXTERNAL MUX CHIP | WITH 2 EXTERNAL MUX CHIPS | WITH 3 EXTERNAL MUX CHIPS |
|---|---|---|---|---|
| 12 | 8  | 4 + 8 = 12  | 3 + 16 = 19 | --- |
| 14 | 10 | 6 + 8 = 14  | 5 + 16 = 21 | 3 + 24 = 27 |
| 16 | 12 | 8 + 8 = 16  | 7 + 16 = 23 | 3 + 24 = 27 |
| 18 | 14 | 10 + 8 = 18 | 9 + 16 = 25 | 3 + 24 = 27 |
| 20 | 16 | 12 + 8 = 20 | 11 + 16 = 27| 3 + 24 = 27 |

| CCW CHAN BITS | MUX=00 INT.MUX CHANNEL SELECTED | MUX=01 EXT.MUX CHANNEL SELECTED | MUX=10 EXT.MUX. CHANNEL SELECTED | MUX=11 EXT.MUX. CHANNEL SELECTED |
|---|---|---|---|---|
| 00000 | END OF QUEUE | END OF QUEUE | END OF QUEUE | END OF QUEUE |
| 00001 | ETRIG1/AN1 | ETRIG1/AN1 | ETRIG1/AN1 | ETRIG1/AN1 |
| 00010 | $(V_{RH0}-V_{RL0})\div 2$ | $(V_{RH0}-V_{RL0})\div 2$ | $(V_{RH0}-V_{RL0})\div 2$ | $(V_{RH0}-V_{RL0})\div 2$ |
| 00011 | $(V_{RH1}-V_{RL1})\div 2$ | $(V_{RH1}-V_{RL1})\div 2$ | $(V_{RH1}-V_{RL1})\div 2$ | $(V_{RH1}-V_{RL1})\div 2$ |
| 00100 | $V_{SSA}/V_{RL0}$ | $V_{SSA}/V_{RL0}$ | $V_{SSA}/V_{RL0}$ | $V_{SSA}/V_{RL0}$ |
| 00101 | $V_{DDA}/V_{RH0}$ | $V_{DDA}/V_{RH0}$ | $V_{DDA}/V_{RH0}$ | $V_{DDA}/V_{RH0}$ |
| 00110 | $AN6/V_{RL1}$ | $AN6/V_{RL1}$ | $AN6/V_{RL1}$ | $AN6/V_{RL1}$ |
| 00111 | $AN7/V_{RH1}$ | $AN7/V_{RH1}$ | $AN7/V_{RH1}$ | $AN7/V_{RH1}$ |
| 01000 | AN8 | AN8 | AN8 | $AN_Z$ |
| 01001 | ETRIG2/AN9 | ETRIG2/AN9 | ETRIG2/AN9 | $AN_Z$ |
| 01010 | AN10 | AN10 | AN10 | $AN_Z$ |
| 01011 | AN11 | AN11 | AN11 | $AN_Z$ |
| 01100 | AN12 | AN12 | AN12 | $AN_Z$ |
| 01101 | AN13 | AN13 | AN13 | $AN_Z$ |
| 01110 | AN14 | AN14 | AN14 | $AN_Z$ |
| 01111 | AN15 | AN15 | AN15 | $AN_Z$ |
| 10000 | AN16 | $AN_X$ | $AN_X$ | $AN_X$ |
| 10001 | AN17 | AN17 | $AN_Y$ | $AN_Y$ |
| 10010 | AN18 | $AN_X$ | $AN_X$ | $AN_X$ |
| 10011 | UNUSED | UNUSED | $AN_Y$ | $AN_Y$ |
| 10100 | AN20 | $AN_X$ | $AN_X$ | $AN_X$ |
| 10101 | UNUSED | UNUSED | $AN_Y$ | $AN_Y$ |
| 10110 | AN22 | $AN_X$ | $AN_X$ | $AN_X$ |
| 10111 | UNUSED | UNUSED | $AN_Y$ | $AN_Y$ |
| 11000 | UNUSED | $AN_X$ | $AN_X$ | $AN_X$ |
| 11001 | UNUSED | UNUSED | $AN_Y$ | $AN_Y$ |
| 11010 | UNUSED | $AN_X$ | $AN_X$ | $AN_X$ |
| 11011 | UNUSED | UNUSED | $AN_Y$ | $AN_Y$ |
| 11100 | UNUSED | $AN_X$ | $AN_X$ | $AN_X$ |
| 11101 | UNUSED | UNUSED | $AN_Y$ | $AN_Y$ |
| 11110 | UNUSED | $AN_X$ | $AN_X$ | $AN_X$ |
| 11111 | UNUSED | UNUSED | $AN_Y$ | $AN_Y$ |

*FIG. 9*

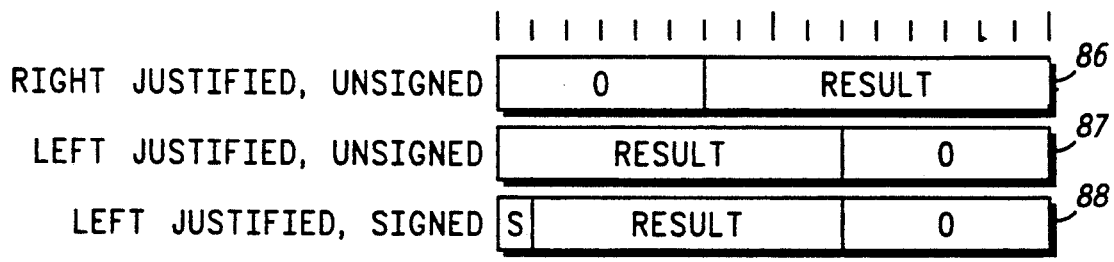
FIG. 11
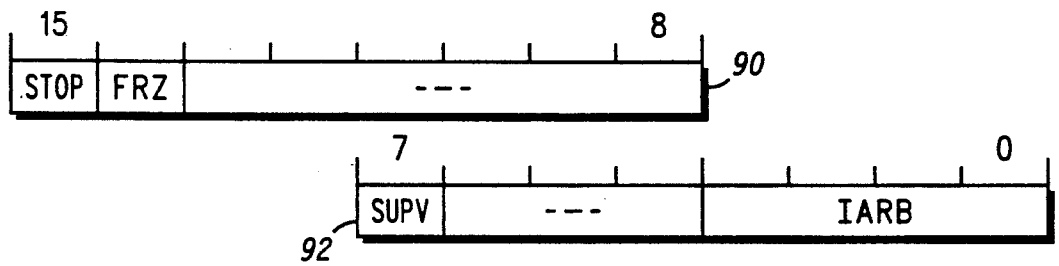
FIG. 12
FIG. 13
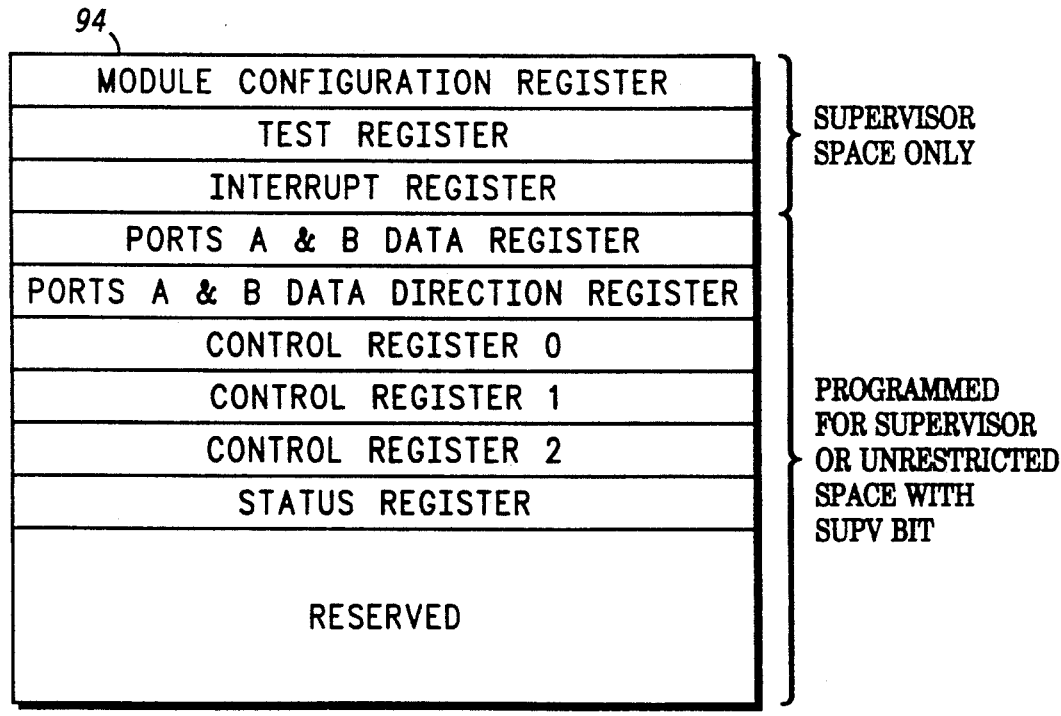

|     | OFFSET FROM BASE ADDRESS | REGISTER NAME |
|---|---|---|

| | RSLT0 | $x0A0 | QADC RESULT REG 0 (RSLT0) |
|---|---|---|---|
| | RSLT1 | $x0A2 | QADC RESULT REG 1 (RSLT1) |
| | RSLT2 | | QADC RESULT REG 2 (RSLT2) |
| | RSLT3 | | QADC RESULT REG 3 (RSLT3) |
| | RSLT4 | | QADC RESULT REG 4 (RSLT4) |
| | RSLT5 | | QADC RESULT REG 5 (RSLT5) |
| | RSLT6 | | QADC RESULT REG 6 (RSLT6) |
| | RSLT7 | | QADC RESULT REG 7 (RSLT7) |
| | RSLT31 | $x0DE | QADC RESULT REG 31 (RSLT31) |

} RIGHT JUSTIFIED UNSIGNED

| RSLT0 | | $x120 | QADC RESULT REG 0 (RSLT0) |
|---|---|---|---|
| RSLT1 | | $x122 | QADC RESULT REG 1 (RSLT1) |
| RSLT2 | | | QADC RESULT REG 2 (RSLT2) |
| RSLT3 | | | QADC RESULT REG 3 (RSLT3) |
| RSLT4 | | | QADC RESULT REG 4 (RSLT4) |
| RSLT5 | | | QADC RESULT REG 5 (RSLT5) |
| RSLT6 | | | QADC RESULT REG 6 (RSLT6) |
| RSLT7 | | | QADC RESULT REG 7 (RSLT7) |
| RSLT31 | | $x15E | QADC RESULT REG 31 (RSLT31) |

} LEFT JUSTIFIED SIGNED

| RSLT0 | | $x1A0 | QADC RESULT REG 0 (RSLT0) |
|---|---|---|---|
| RSLT1 | | $x1A2 | QADC RESULT REG 1 (RSLT1) |
| RSLT2 | | | QADC RESULT REG 2 (RSLT2) |
| RSLT3 | | | QADC RESULT REG 3 (RSLT3) |
| RSLT4 | | | QADC RESULT REG 4 (RSLT4) |
| RSLT5 | | | QADC RESULT REG 5 (RSLT5) |
| RSLT6 | | | QADC RESULT REG 6 (RSLT6) |
| RSLT7 | | | QADC RESULT REG 7 (RSLT7) |
| RSLT31 | | $x1DE | QADC RESULT REG 31 (RSLT31) |

} LEFT JUSTIFIED UNSIGNED

*FIG. 21*

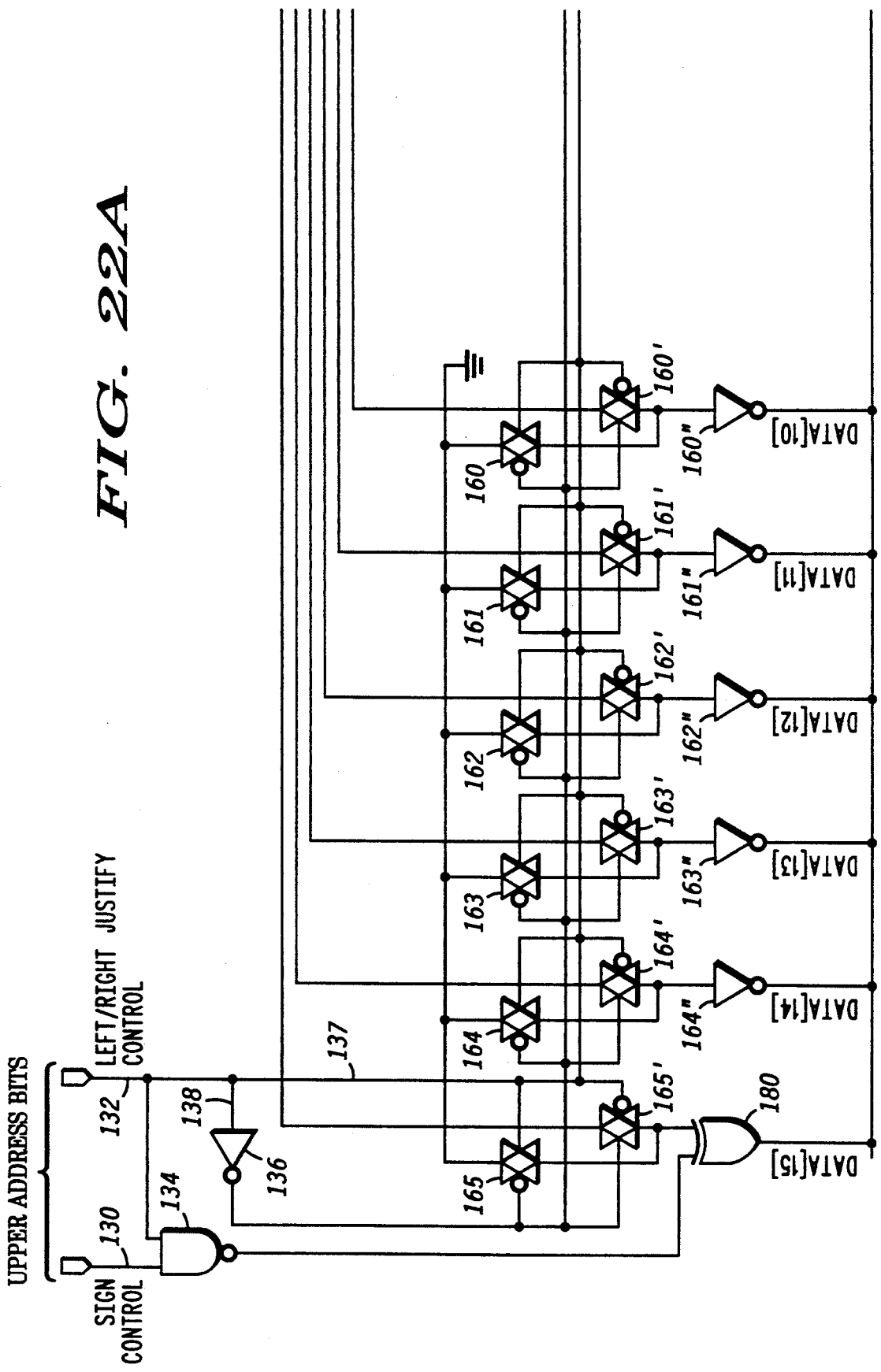

AUTOMATIC SELECTION OF EXTERNAL MULTIPLEXER CHANNELS BY AN A/D CONVERTER INTEGRATED CIRCUIT

This application is a continuation of prior application Ser. No. 577,249, filed Sep. 4, 1990, now abandoned.

RELATED INVENTIONS

1. Automatic A/D Converter Operation Using A Programmable Control Table, invented by William D. Huston et al., U.S. Ser. No. 07/852,830, which is a continuation of prior application Ser. No. 07/577,223, filed concurrently herewith and assigned to the assignee of the present invention.

2. Automatic A/D Converter Operation Using Programmable Sample Time, invented by Jules D. Campbell, Jr. et al., U.S. Ser. No. 07/577,222, now U.S. Pat. No. 5,081,454, filed concurrently herewith and assigned to the assignee of the present invention.

3. Automatic A/D Converter Operation With Selectable Result Format, invented by Jules D. Campbell, Jr. et al., U.S. Ser. No. 07/577,247, filed concurrently herewith and assigned to the assignee of the present invention.

TECHNICAL FIELD OF THE INVENTION

This invention relates generally to analog-to-digital converters, and, more particularly, to an A/D converter system comprising an A/D converter integrated circuit which may be coupled to and control at least one multiplexer integrated circuit.

BACKGROUND INFORMATION

The present invention has utility in applications requiring the conversion of an analog signal into a digital signal, for example for computer sensing of analog information in an automotive control system. To further illustrate, in an automotive engine control system, a microcomputer requires analog signal information from various transducers to be converted into digital signal information before it can be processed by the microcomputer. Examples of such analog signal information are the outputs of sensors for manifold pressure, oxygen, rotational speed, operator input, battery voltage, anti-knock, etc.

In a typical automotive application, many different analog signals need to be converted. It is known to provide an A/D converter module with a number of channel inputs, each responsive to a corresponding analog signal, and a multiplexer for gating the analog signals into the A/D circuit for conversion into digital signals. The optimum number of channel inputs depends upon the particular application for which the A/D converter is used.

There is a significant need in this technology for a way to increase the number of analog signals that can be converted, while maintaining the number of A/D converter I/O pins at a minimum. There is also a need to provide A/D converter circuits that can accommodate a wide range of number of analog inputs, depending upon the particular application.

It is known to provide one or more external multiplexer (MUX) IC's for an A/D converter module. In this way, the number of analog signals that can be sampled and converted can be increased.

In addition, the use of external MUX IC's permits a plurality of analog signals to be terminated nearer their sources, thereby minimizing the number of cables or conductors between the analog sources and the A/D converter module. The attendant reduction in weight, volume, and shielding has particularly important advantages for vehicle applications.

Each MUX external to an A/D converter module may be responsive to, for example, eight analog inputs. Under software control, involving the central processing unit (CPU) of the A/D converter system, individual MUX's may be addressed by the CPU, and one of the eight analog values may be input into the converter for conversion to a corresponding digital value. However, this system has the disadvantage of requiring the involvement of the system CPU software.

Thus there is a significant need to provide an A/D converter system in which external MUX IC's can be utilized without unduly burdening the system CPU's software operation.

BRIEF SUMMARY OF INVENTION

The present invention fulfills the above-mentioned requirements by providing an A/D converter system in which external MUX's are addressed and sampled automatically by the A/D converter module without involving the main system CPU. It should be understood that the term "module" is used herein to indicate either an integrated circuit or a portion of an integrated circuit.

Accordingly, it is an object of the present invention to provide an A/D converter system which can accommodate a wide scope of analog inputs while minimizing the I/O pin count of the IC of which the A/D converter module is a part.

It is another object of the present invention to provide an A/D converter system which can utilize external MUX circuits without burdening the software operating in the system CPU.

These and other objects are achieved in accordance with a preferred embodiment of the invention by providing an analog-to-digital conversion system for use with at least one multiplexer circuit having a plurality of data input terminals, at least one address input port, and at least one data output terminal, the conversion system comprising an analog-to-digital converter, means for reading at least one command word, the command word specifying an address identifying one of the data input terminals, and means responsive to the reading means for sampling an analog signal on the one data input terminal.

BRIEF DESCRIPTION OF THE DRAWINGS

The invention is pointed out with particularity in the appended claims. However, other features of the intention will become more apparent and the invention will be best understood by referring to the following detailed description in conjunction with the accompanying drawings in which:

FIG. 4 defines the Intermodule Bus (IMB) signals of the A/D converter module of the present invention.

FIG. 5 shows an address map for the control registers, Conversion Command Word table, and the Conversion Result Table of the A/D converter module.

FIG. 9 is a table illustrating how the CCW CHAN bits specify the functions of the various I/O pins for 0, 1, 2, or 3 external multiplexer IC's.

FIG. 11 illustrates the data format options of Result Words stored in the Conversion Result Table.

FIG. 12 shows the format of the Module Configuration Register of the A/D converter module.

FIG. 13 illustrates the use of the SUPV bit of the Module Configuration Register of the A/D converter module.

FIG. 21 illustrates the addresses required to read Result Words stored in the Conversion Result Table in at least three different data format options.

FIGS. 22A and 22B taken together show detailed logic implementation of the Data Format logic 68 shown in FIG. 2.

DESCRIPTION OF PREFERRED EMBODIMENT

Overview

Figure 1:
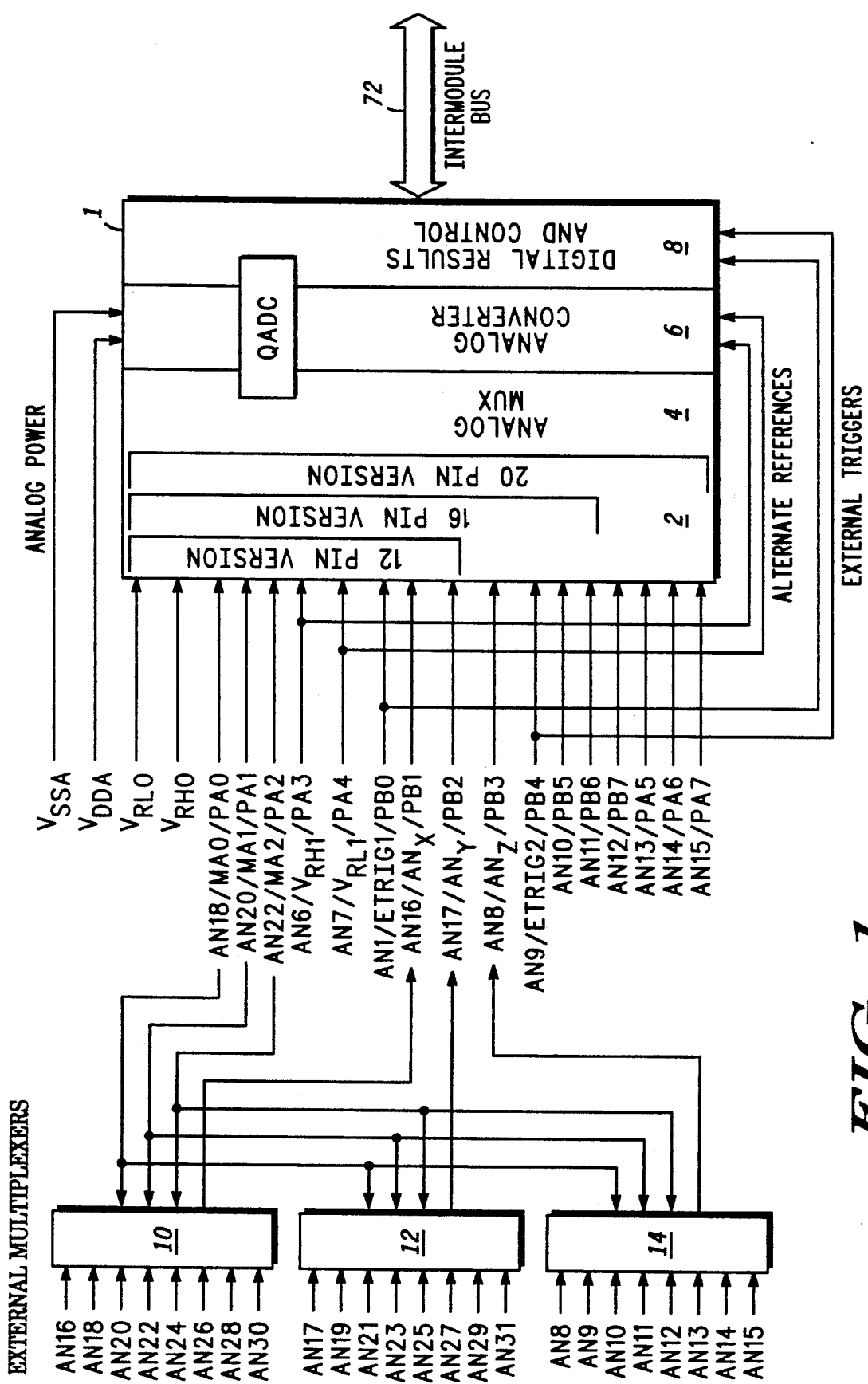
FIG. 1 shows an A/D converter system, comprising an A/D converter module and one or more multiplexer integrated circuits, in accordance with a preferred embodiment of the present invention.

FIG. 1 shows an A/D converter system, comprising an A/D converter integrated circuit (IC) and one or more multiplexer integrated circuits. A Queued A/D Converter module (QADC) 1 is shown coupled to one or more external multiplexers (MUX's) 10, 12, and 14. In a preferred embodiment QADC 1 and the external MUX's are implemented as integrated circuits. External multiplexers are commercially available from Motorola, Inc., for example, as part numbers MC14051 or MC74HC4051.

The Queued A/D Converter module (QADC) 1 is described herein as "queued", because, as will be described in greater detail below, it operates in response to one or more queues of Conversion Command Words.

QADC 1 comprises a plurality of I/O pins, shown generally by reference numeral 2, an analog MUX portion 4, an analog converter portion 6, and a portion for performing control and storing digital results 8.

The I/O pin configurations of QADC vary from a 12-pin version to an 20-pin version. Also coupled to appropriate pins of QADC 1 are power supplies $V_{SSA}$ and $V_{DDA}$, references $V_{RH0}$ and $V_{RL0}$, alternate references $V_{RH1}$ and $V_{RL1}$, and external triggers ETRIG1 and ETRIG2.

Eight of the I/O pins of QADC 1 function as Port A I/O pins and are labeled PA0-PA7, while eight others function as Port B input pins and are labeled PB0-PB7. The prefix "PA" designates Port A, and the prefix "PB" designates Port B.

The external MUX's 10, 12, and 14 are shown comprising eight analog input channels each. For example, MUX 10 has analog input channels AN16, AN18, AN20, AN22, AN24, AN26, AN28, and AN30.

The external MUX's are addressed via address lines MA0-MA2. The prefix "MA" designates Multiplexed Address. The outputs of MUX's 10, 12, and 14 are coupled to lines ANx, ANy, and ANz, respectively. The prefix "AN" designates Analog Input.

As will be discussed further below, many of the I/O pins 2 are programmable to perform multiple functions.

As will be shown and described below, QADC 1 automatically reads analog signals being input into MUX's 10, 12, and 14 and converts the analog values into digital values which are stored in the digital results portion 8 of QADC 1.

Queued A/D Converter Module

Figure 2:
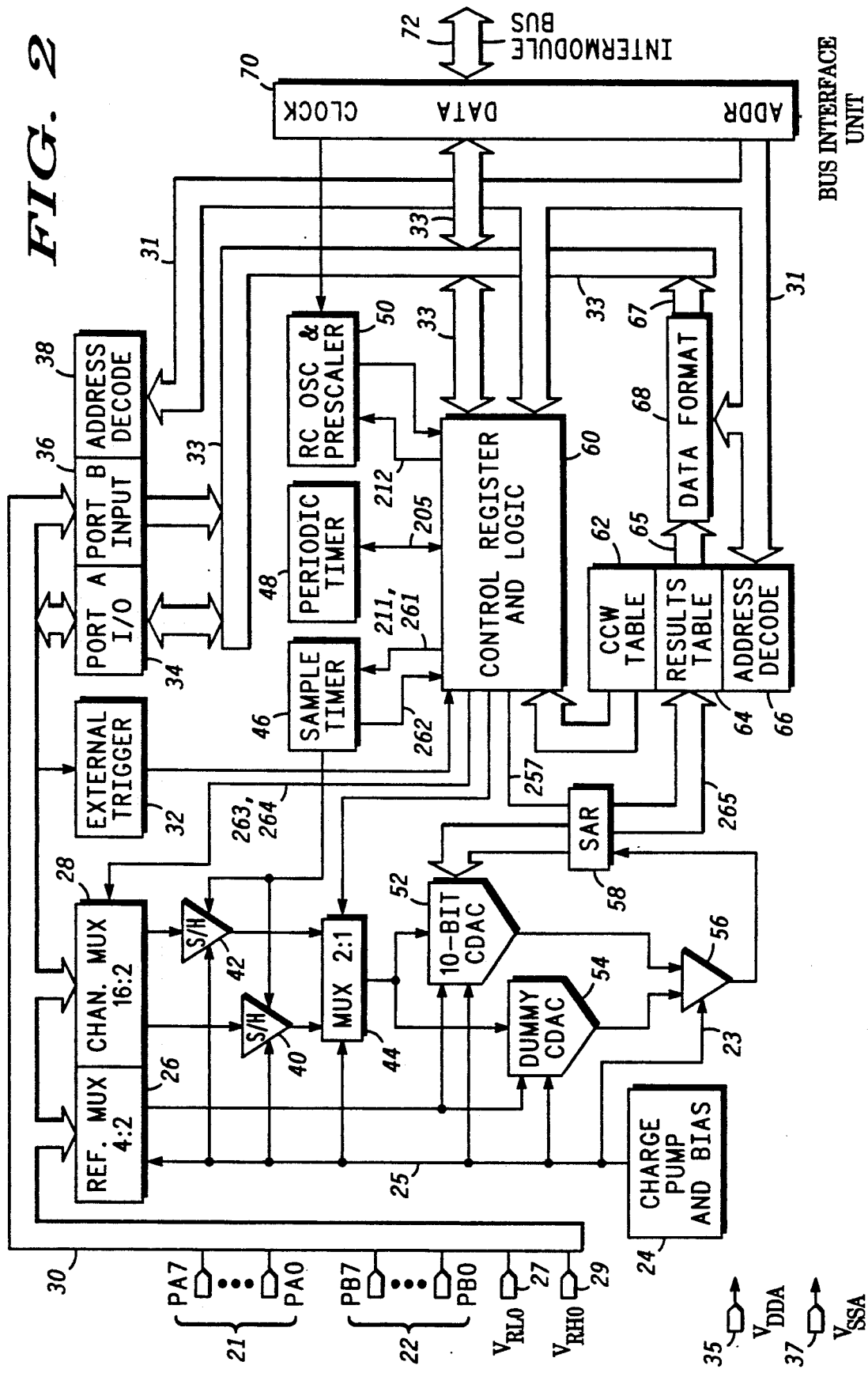
FIG. 2 shows a block diagram of the A/D converter module of the present invention.

FIG. 2 shows a block diagram of the A/D converter module of the present invention. The Queued A/D Converter module (QADC) 1 comprises Port A, indicated by reference numeral 21, including pins PA0–PA7, and Port B, indicated by reference numeral 22, including pins PB0–PB7. Ports A and B are coupled to bus 30. A pair of primary reference voltages $V_{RL0}$ 27 and $V_{RH0}$ 29 are also coupled to bus 30.

Also coupled to bus 30 are a Reference MUX (4:2) 26; a Channel MUX (16:2) 28; an External Trigger circuit 32; Port A I/O circuit 34; and Port B input circuit 36. Address Decode circuit 38 is coupled to Port A I/O circuit 34 and Port B input circuit 36.

The Queued A/D Converter module 1 comprises a 10-bit successive approximation converter portion which includes Sample-and-Hold circuits 40 and 42; a 2:1 MUX 44; 10-bit Capacitive Digital-to-Analog Converter (CDAC) (charge redistribution type) 52; Dummy CDAC 54; Comparator 56; and Successive Approximation Register (SAR) 58.

It will be apparent to those of ordinary skill in the art that the successive approximation converter may comprise more or fewer than 10 bits. It will also be apparent that the Digital-to-Analog Converter may be of the resistive-only type, the capacitive-only type, or the resistive/capacitive type.

Charge Pump and Bias circuit 24 provides bias voltages to MUX's 26, 28, and 44, to Sample-and-Hold circuits 40 and 42, to CDAC 52 and Dummy CDAC 54, and to Comparator 56.

The Queued A/D Converter module 1 further comprises a Bus Interface Unit (BIU) 70 coupled to an Intermodule Bus 72. The Intermodule Bus 72, which transmits clock, data, control, and address information bi-directionally, may be coupled to a host data processing system (not shown).

Coupled to Bus Interface Unit 70 via internal address bus 31 are Address Decode circuit 38; Control Register and Logic circuit 60; Data Format circuit 68; and Address Decode circuit 66.

Also coupled to Bus Interface Unit 70 via internal data bus 33 are Port A I/O circuit 34; Port B Input circuit 36; Control Register and Logic circuit 60; and Data Format circuit 68.

Also coupled to Control Register and Logic circuit 60 are External Trigger 32; Sample Timer 46; Periodic Timer 48; Prescaler circuit 50; a random access memory (RAM) storing a table of Command Control Words (CCW's) 62 and a Results Table 64; an Address Decode circuit 66; SAR 58; 2:1 sample and hold MUX 44; and 16:2 Channel MUX 28.

Also coupled to the Queued A/D Converter module 1 are suitable analog power supply voltages via pins VDDA 35 and VSSA 37.

External Pins

In a preferred embodiment, 16 analog channels are provided in the internal multiplexing circuitry of the QADC module 1. The number of channels available externally depends upon package pin availability, and whether external multiplexing is employed. The number of channels in an expanded, externally multiplexed mode is 27 in a preferred embodiment (with a 5-bit CCW CHAN field there are also four internal channels and an End-of-Queue control word). It should be understood by one of ordinary skill in the art that the channel field may optionally be increased or decreased to allow more or fewer channels.

The QADC module 1 has up to twenty external pins as shown in FIGS. 1 and 2. All of these pins except the power and reference pins can be used as general purpose digital port pins. Lower pin-count versions of the QADC module 1 can be produced by reducing the number of channel/port pins. Versions with as few as twelve pins may comprise eight analog channels, two power pins, and two reference pins.

Control Register and Logic Circuit

Figure 3:
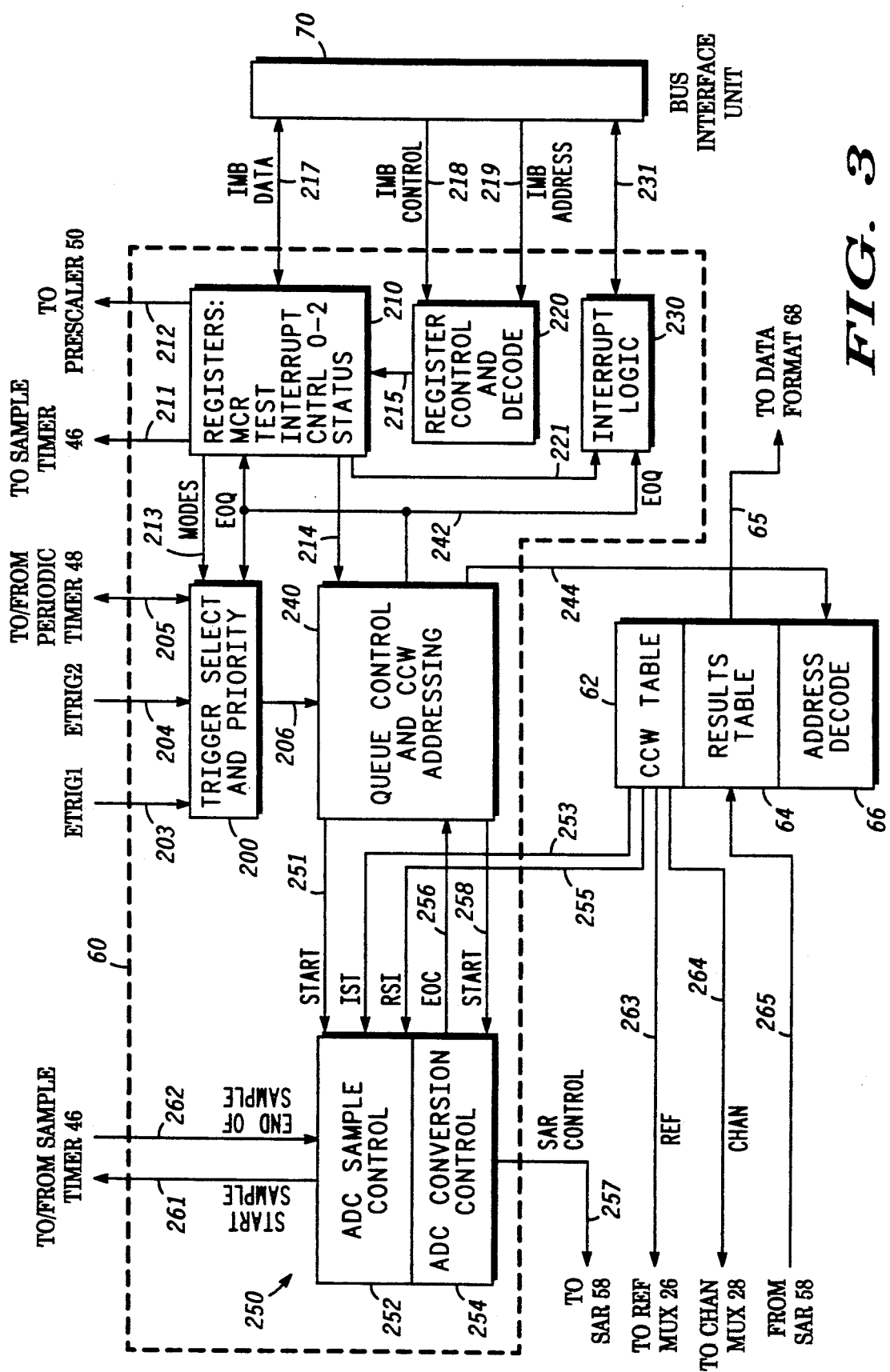
FIG. 3 shows a block diagram of the Control Register and Logic circuit 60 illustrated in FIG. 2.

FIG. 3 shows a block diagram of Control Register and Logic circuit (shown generally within the dashed line and indicated by reference numeral 60) and various signal paths between it and Bus Interface Unit 70, CCW Table 62, Results Table 64, Address Decode circuit 66, and other circuitry shown in FIG. 2.

Control Register and Logic circuit 60 comprises Trigger Select and Priority circuit 200, Registers 210, Register Control and Decode circuit 220, Interrupt Logic 230, Queue Control and CCW Addressing circuitry 240, and ADC Sample Control and Conversion Control (indicated generally by reference numeral 250).

The Trigger Select and Priority circuit 200 is responsible for determining the type of trigger for initiating an A/D conversion sequence, in response to mode information from the Register circuitry 210. It is also responsible for selecting Queue 1 or Queue 2 for the conversion sequence in response to control information decoded by the control registers.

The Trigger Select and Priority circuit 200 is responsive to external trigger signals ETRIG1 and ETRIG2 via lines 203 and 204, respectively. Trigger Select and Priority circuit 200 is also coupled to the Periodic Timer 48 via line 205. Trigger Select and Priority circuit 200 is responsive to mode control signals from the control registers via line 213 and to an End-of-Queue (EOQ) signal from Queue Control and CCW Addressing circuitry 240 via line 242. Trigger Select and Priority circuit 200 generates control signals to Queue Control and CCW Addressing circuitry 240 via signal path 206.

It will be understood by those of ordinary skill in the art that the terms "signal path" or "line", as used herein, may refer to a single conductor or a multiple-conductor bus, or other suitable signal path, as appropriate to the implementation.

Figure 6:
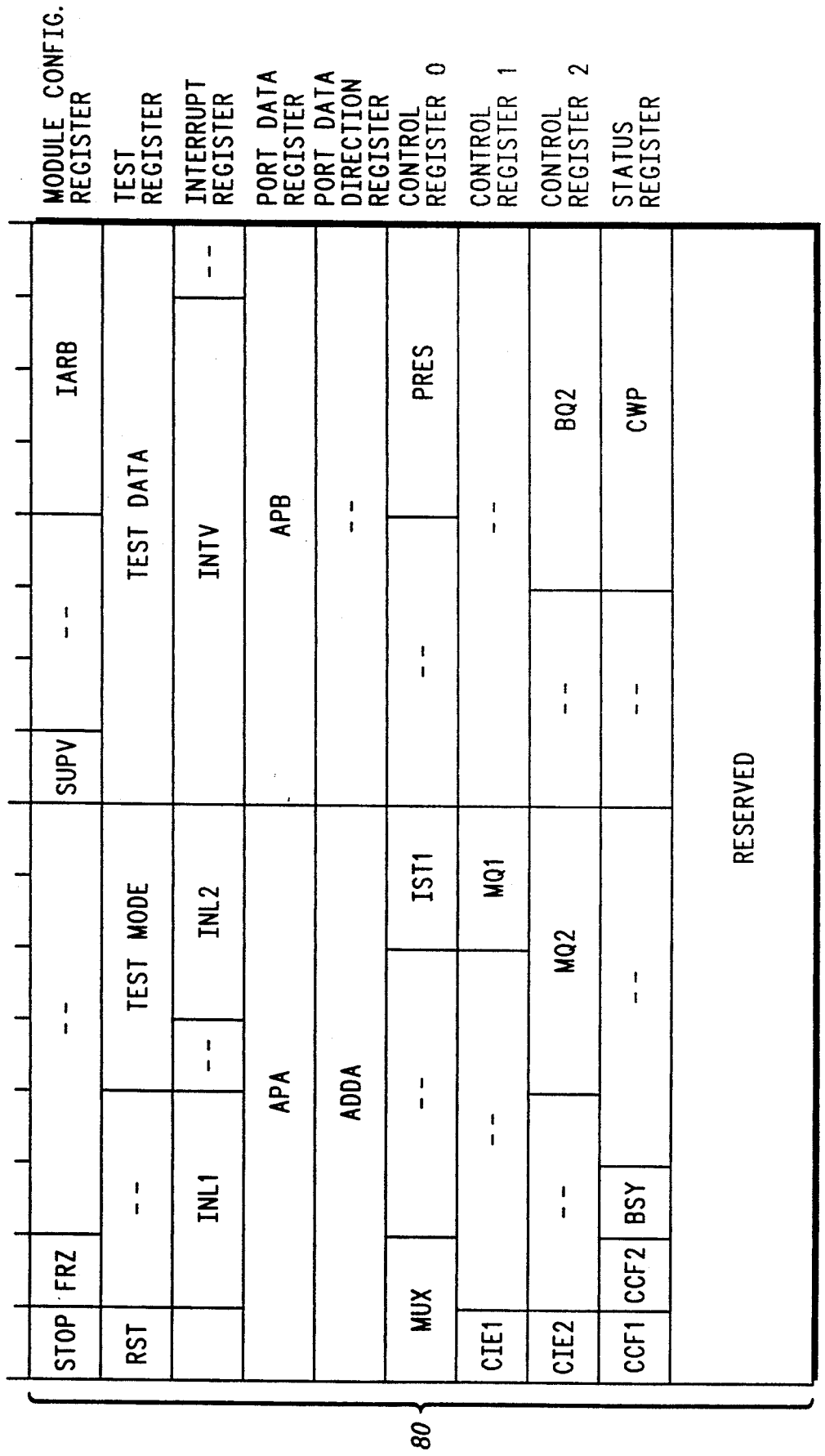
FIG. 6 is a more detailed address map showing the formats of the Control, Port, and Status Registers 80 shown in FIG. 5.

Register circuitry 210 comprises the registers shown in FIG. 6 and not otherwise shown in FIG. 2; i.e., a Module Configuration Register, a Test Register, an Interrupt Register, Control Registers 0-2, and a Status Register. The function of the Register circuitry 210 is to enable the automatic control of the operation of the QADC, once the registers are loaded by the host system software.

Register circuitry 210 generates control signals to the Sample Timer 46 via line 211, to the Prescaler 50 via line 212, to Trigger Select and Priority circuit 200 via line 213, to the Queue Control and CCW Addressing circuit 240 via line 214, and to Interrupt Logic 230 via line 221.

Register circuitry 210 receives control signals from Register Control and Decode circuit 220 via signal path 215 and an End-of-Queue (EOQ) signal from Queue Control and CCW Addressing circuit 240 via line 242.

Register circuitry 210 is also coupled to Bus Interface Unit 70 via bi-directional bus 217.

Register Control and Decode circuit 220 receives control and address information via busses 218 and 219, respectively, from Bus Interface Unit 70 and generates control signals to Register circuitry 210 via signal path 215. The function of Register Control and Decode circuit 220 is to provide control and addressing circuitry for the various registers within Register circuitry 210.

Interrupt Logic 230 operates to generate an interrupt signal to the host CPU upon conclusion of a conversion sequence (if enabled). Interrupt Logic 230 receives control signals from Register circuitry 210 via signal path 221 and an EOQ signal from Queue Control and CCW Addressing circuit 240 via line 242. It is also coupled to the Bus Interface Unit 70 via signal path 231.

Queue Control and CCW Addressing circuitry 240 is responsible for controlling CCW addressing and the start of sampling and conversion operations. The Queue Control and CCW Addressing circuitry 240 receives control signals from the Trigger Select and Priority circuit 200 via line 206, from the Register circuitry 210 via line 214, and from the ADC Conversion Control circuit 254 via line 256. It generates control signals to the Trigger Select and Priority circuit 200, to the Register circuitry 210, and to the Interrupt Logic circuitry 230 via line 242. It also generates control signals to the Address Decode circuitry 66 via line 244, to the ADC Conversion Control circuit 254 via line 258, and to the ADC Sample Control 252 via line 251.

ADC Sample Control 252 is responsible for notifying the S/H circuits 40 and 42 (refer to FIG. 2), via the Sample Timer 46, to begin sampling. It is also responsible for notifying the ADC Conversion Control 254 when sampling is completed. The ADC Sample Control 252 receives control signals from Sample Timer 46 via line 262, from Queue Control and CCW Addressing circuit 240 via line 251, and from the CCW Table via line 253 (Input Sample Time) and line 255 (Re-sample Inhibit). It generates control signals to the Sample Timer 46 via line 261 and to the ADC Conversion Control 254.

The ADC Conversion Control 254 is responsible for initiating a conversion operation by the SAR 58 and for informing the Queue Control and CCW Addressing circuit 240 upon conclusion of the conversion operation. The ADC Conversion Control 254 receives control signals from the ADC Sample Control 252. It also receives control signals from the Queue Control and CCW Addressing circuit 240 via line 258, and it generates control signals to the SAR 58 via line 257.

As shown in FIG. 3, in response to a decoded CCW a REF control signal may be transmitted to the REF. MUX 26 via line 263, and a CHAN control signal may be transmitted to the CHAN. MUX 28 via line 264.

Upon conclusion of a conversion operation, a digital value is transmitted via line 265 from SAR 58 and stored in Results Table 65.

Intermodule Bus (IMB) Interface

FIG. 4 is a table defining the Intermodule Bus (IMB) signals of the A/D converter module of the present invention.

The address bus IADDR and data bus IDATA, along with their associated control and handshake lines, are used to transfer data between the IMB 72 and the QADC module 1.

The reset signal IMSTRSTB initializes certain register bits to their default states. These default states are described in the register descriptions below. The master reset signal IMSTRSTB and system reset signal ISYSRSTB are used to reset the BIU (Bus Interface Unit) state machine.

ISIZ and IADDR are used to determine the size of data (byte or word). The QADC module 1 has certain bits that are only accessible in test mode, and the ITSTMODB line is used for test mode operation.

Address Map

FIG. 5 shows an address map (indicated generally by reference numeral 75) for the control registers, Conversion Command Word table, and the Conversion Result Table of the A/D converter module.

The QADC module 1 utilizes 512 bytes, or 256 words, of address space, as shown in FIG. 5. Of the words actually implemented, 9 words are control, status, and port registers (indicated generally by reference numeral 80), 32 words are Conversion Command Words (indicated generally by reference numeral 81), and 32 words are used for each data format type of the result table (indicated generally by reference numerals 83, 85, and 89, respectively). The remaining words are reserved for possible future expansion.

The first block 80 of the address map 75 contains the 9 words used for control, status, and port information. These permit a host data processing system (not shown) to initialize the QADC module 1 into the desired configuration and mode of operation. Also included are status bits that the host system may read to identify an interrupt and to determine other information about the conversion operation of the QADC module 1. The content of these registers is shown in somewhat greater detail in FIG. 6.

The next block 81 of the address map 75 is the Conversion Command Word table. In the current embodiment there are up to 32 words to hold the desired A/D conversion sequences, but this could optionally be increased or decreased. A Conversion Command Word (CCW) is a 16-bit word, with eight implemented bits in four fields, and eight bits in optional control fields.

Figures 7, 10:
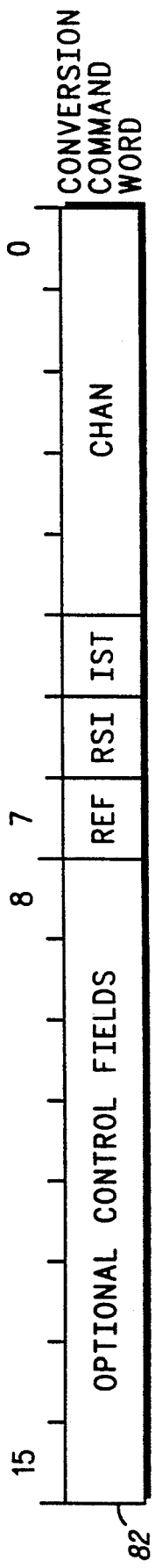
FIG. 7 shows the format of a Conversion Command Word (CCW) of the A/D converter module.
FIG. 10 is a table illustrating the number of analog channels available with different numbers of external multiplexer IC's, in terms of the number of I/O pins allocated to the A/D converter module.

The content of the CCW 82 is illustrated in FIG. 7. Each CCW provides the converter with channel number (CHAN), input sample time (IST), reference pair (REF), and causes the converter to take an input sample, convert that analog value, and put the result in the corresponding word of the result register table. The CCW also includes a field RSI (re-sample inhibit). In addition the CCW may include one or more optional control fields if desired, such as a field to specify the converter resolution and a field to designate the data result alignment. The fields of the CCW and their functions are explained in greater detail below under the sub-heading "Conversion Command Word".

The result register can be read at the address ranges shown as Conversion Result Tables 83, 85, and 89. There is in actuality a single result register table but three different ways in which to read it, as explained in the section below entitled "A/D Result Data Format Options".

Thus there is one 32-word Conversion Result Table that appears in three places in the address map 75. The first block 83 presents the result data in right-justified (unsigned) format, the second block 85 is in left-justified (signed) format, and the third block 89 is a left-justified (unsigned) result.

Details on the control registers, status registers, port registers, and the CCW are provided below. Read accesses of reserved register locations or unused bits returns "0" and writes to reserved and unused space has no effect on the QADC operation.

Conversion Command Word Table

Figure 8:
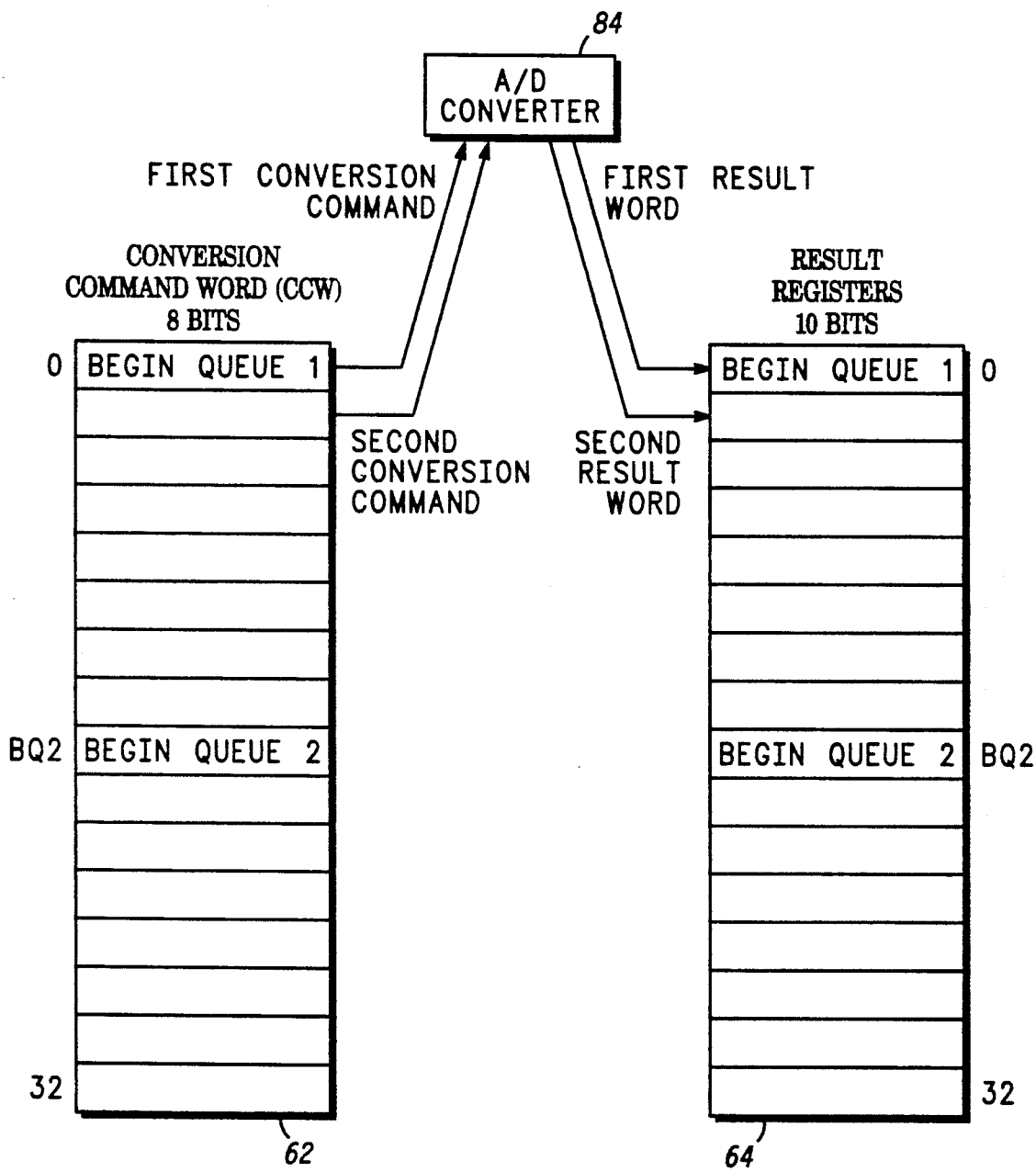
FIG. 8 is a conceptual diagram showing how Conversion Command Words are used to produce Result Words which are stored in the Conversion Result Table.

FIG. 8 is a conceptual diagram showing how Conversion Command Words are used to produce Result Words which are stored in the Conversion Result Table.

The central element in software control of the QADC module 1 is the Conversion Command Word Table. In a preferred embodiment, there are two queues in the table which, depending on the application, can be operated in several different trigger modes and effective scan rates. It will be apparent to one of ordinary skill that more or fewer than two queues may be employed.

There are two reasons for including two queues in the QADC. One reason is that there are two different cases for automatically scanning analog input channels. One case is to get one sample from all or some analog input pins.

The other case is to automatically take multiple samples of one channel in rapid succession, so that host system software can use smoothing algorithms to calculate a more accurate value. In either case, an automatic scan that puts the results in a table saves the host system software from having to initiate each conversion, wait, get the result, and save it. The CCW table architecture permits the host system software to use either method, or even a combination; for example, 16 results could be used for four samples on each of four channels.

The other reason for providing two CCW queues is that two different operating modes can be used at the same time. Usually, analog inputs on some channels need to be converted often because they have rapidly changing values, whereas analog inputs on other channels change relatively slowly, such as temperature drift, battery voltage, and operator inputs.

In a preferred embodiment, Queue 1 is normally utilized for frequently occurring or time-critical conversion sequences. Queue 2 is normally utilized for relatively infrequent or non-time-critical conversion sequences. When a conversion sequence is initiated from Queue 1, any conversion in progress from Queue 2 is aborted. When the Queue 1 conversion sequence is completed, the aborted Queue 2 conversion sequence is restarted at its top location.

The host system software can receive an interrupt that occurs just after the Conversion Result Table has been filled with newly converted digital values from either queue. The interrupt permits the host system software to analyze newly converted values when they are fresh.

The host system software is relieved of the burden of initiating the A/D conversion sequence, of initiating each A/D conversion, and of moving each result to host system RAM. Thus the QADC module 1 absorbs the overhead of running the A/D converter system. The host system software only needs to program the QADC initially and then analyze the on-going results.

The following sections describe the basic operation of the CCW queues and the various modes that use the CCW queues.

Conversion Queue Operation

To prepare the QADC module 1 for a conversion sequence, the host system software fills up the table of Conversion Command Words (reference numeral 81 in FIG. 5 and reference numeral 62 in FIG. 8) to establish the desired conversion sequences. The host system software establishes the criteria for initiating the conversion sequences in Control Registers 1 and 2. Other registers also require initialization, for example, the Module Configuration Register, the Interrupt Register, and Control Register 0.

The sequences may be initiated (triggered) by a host system software command, the elapse of the QADC module periodic timer interval, an external trigger signal, or the completion of the previous conversion sequence (i.e. continuous mode). By whichever method the sequence of conversions is initiated, the conversions progress in the same way.

After the CCW table and all of the control registers are initialized, the QADC waits for a trigger condition for either queue. When triggered, the A/D converter obtains the first CCW from the triggered queue and executes it. Refer to FIG. 8.

The first part of a conversion is the sample phase. Once the sampled analog level is transferred to the converter, the sample-and-hold circuit proceeds with sampling the next channel.

The CCW specifies whether the sample time is to be the default time or an alternate time. For the first sample of a conversion sequence, the default sample time is a specified number of conversion clock cycles. For all subsequent samples the default sample time is the conversion time. The alternate sample time is chosen instead of the default when slower sample times are needed for high impedance sources or for specific delay intervals.

When each analog-to-digital conversion is complete, the result is written to the corresponding location in the Conversion Result Table. The converter then obtains the next CCW from the queue and proceeds with that conversion.

The QADC executes each CCW in the queue until one of three End of Queue (EOQ) indications is detected. One EOQ condition is reaching the physical end of the Queue RAM space, 32 locations in the preferred embodiment. The second EOQ condition is when the BQ2 pointer is reached (see FIG. 8), which indicates the split of the RAM between Queue 1 and Queue 2. This method applies only for indicating the end of Queue 1. The third indication is a CCW with an EOQ code instead of a normal channel selection. When enabled, Queue Conversion Sequence Complete Interrupts are issued to the host system software.

Prescaler

The QADC module uses the IMB System Clock signal as the time base for conversions. The A/D conversion needs a clock signal in a fairly narrow range, and the IMB clock "Iclock" varies widely among applications. The Prescaler (50, FIG. 2) is a modulus-programmable divider that allows the A/D conversion clock to be within the specified range with a wide range of System Clock frequencies. The Prescaler can be used to optimize the A/D conversion time by selecting a System Clock frequency that is an even multiple of the fastest A/D conversion time.

Periodic Timer

It is known in prior A/D conversion systems to use a periodic processor interrupt to begin a conversion sequence of an analog channel or group of analog channels. While the conversion is in progress, the processor attempts to accomplish other work or waits for the A/D conversion to complete. In many real-time applications, this software burden unacceptably impacts the performance of the system. Ideally, a processor need become involved only when converted results are available from the A/D converter module.

Thus, the QADC includes a dedicated periodic interval timer (48, FIG. 2), which, when enabled, automatically initiates A/D conversion sequences. Queue 2 can be programmed to operate in the periodic interval mode. The host system software selects the periodic mode and determines the time interval via Control Register 2. Typically, the host system software would also enable the corresponding Completion Interrupt. This interrupt notifies the host system software that new analog conversion results are available.

In operation, when the timer interval elapses, the queue execution is initiated. Once started, conversion can automatically occur repetitively over multiple channels, if enabled, thus relieving the host system software of the burden of getting the results of each conversion and initiating the next conversion.

Often one queue is configured in the periodic mode and the other queue is set up for one of the other operating modes. For low priority scans, the periodic mode uses somewhat less power than the continuous mode.

Periodic analog conversion allows the host system software to be in synchronization with the hardware conversion scan by including notification that the conversions have just finished. This provides the software the time until the next period in which to read the results, and to know that the values were all read in one sequence, whereas a continuous scan mode does not allow the software to easily conclude that samples of two channels were contiguous data, taken during the same scan.

External Trigger

There are applications that need to synchronize the sampling of analog channels to external events occurring elsewhere in the system. These external events can relate to external timers or system events, for instance, or sense physical conditions, such as an index position of a moving device.

In prior art micro-controllers, software must determine the correct time to start a conversion and then start it at the right time, but due to system latencies (e.g. interrupts, long instructions), it may be difficult to predict the starting time accurately. It is also known, regarding prior art micro-controllers, for the software to use an external interrupt to synchronize the conversions. However, with variable interrupt response time, conversions begin imprecisely in relation to the external signal or event. In many applications, the sample must be taken at a precise time.

An external hardware signal permits a direct path that is independent of software timing errors to start the conversion. The present invention does not rely on software initiation of the conversion start but allows a signal or event which is external to a micro-controller, of which the QADC may be a part, to start the conversion. The external trigger, when implemented with an automated queue or conversion sequence, as in the present invention, allows the A/D converter to collect analog data independent of a host CPU located on the micro-controller or elsewhere.

It is known in stand-alone A/D converters to employ an external trigger to initiate a single conversion. However, the present invention permits an external trigger signal or event to repetitively initiate conversion sequences.

The next external conversion may be enabled when the A/D converter has completed its current set of conversions and an external trigger is asserted. Alternatively, the conversion may restart immediately on assertion of the external trigger signal during a conversion sequence, if the implementation of the external start function is so defined.

The QADC module allows External Trigger input pins to initiate a conversion sequence on Queue 1 and Queue 2.

One usage is to take analog samples at a precise point in the motion of a high speed device, such as an engine. The ability to initiate a conversion in response to an external trigger is very useful in the automotive control environment, since conversions can be synchronized to engine position. There is not time for host system software initiation of the A/D conversions since host system software interrupt response time varies. The source of the External Trigger signal may be the output of a timer channel. The polarity of the trigger signal is programmable, so that the host system software can choose the rising or falling edge to initiate the sequence.

The use of the queue is the same in the External Trigger mode as with the other modes. The trigger signal simply initiates the sequence, rather than the interval timer, as in the periodic mode. Each CCW is obtained and the indicated conversions are performed until one of the End of Queue indications is encountered. When the sequence is complete, the Completion Interrupt is issued, if enabled, and the queue waits for the next edge on the External Trigger pin.

Continuous Conversions

In the preferred embodiment, only Queue 2 can be configured to operate continuously, since a continuous scan on Queue 1 would preclude the operation of Queue 2. When the last address or last-command indication is encountered in Queue 2, the sequence starts over with the top CCW in Queue 2. The continuous mode keeps the Conversion Result Tables updated automatically. The host system software can always read the Conversion Result Table and be assured that the value is no older than the scan time for both queues. The Completion Interrupt may be enabled to notify the host system software of the completion of each cycle through the queue.

Software Initiated Conversion

The above modes have shown three ways to automatically initiate conversions: periodically, upon external trigger stimulus, and continuously. To cover other situations, the host system software can also initiate a conversion sequence. A specific bit pattern in the mode word MQ1 or MQ2 of Control Register 1 or 2, respectively, starts each respective queue at its top CCW. The QADC automatically performs the conversions in the queue until an End of Queue condition is found. Then it stops and resets the mode field (MQ1 or MQ2) to the disabled condition. The next conversion sequence is triggered by a new host system software control word. This mode provides a one-shot scan through the CCW queue.

External Multiplexed Inputs

The number of analog inputs to the QADC may be expanded in the externally multiplexed mode. The full flexibility of the automatic scanning queues are available to externally multiplexed channels. Three of the analog channels (MA0-MA2, FIG. 1) are redefined to act as address bit outputs, and three input pins (ANx, ANy, and ANz) are expanded to represent eight input channels each. This allows a total of three external multiplexers for a total of 24 external channels. Commercially available analog multiplexers such as the MC14051, MC14052, MC74HC4051, and MC74HC4052 available from Motorola, Inc. may be used.

FIG. 1 provides an example of externally expanding the number of channels in this manner. The preferred embodiment may be used with 0, 1, 2, or 3 external MUX's.

FIG. 9 is a table illustrating how the 5-bit CHAN field in the CCW specifies the functions of the various I/O pins for 0, 1, 2, or 3 external multiplexer IC's.

For example, with MUX field in Control Register 0 equal to 00 (i.e. no external MUX), CHAN field=10000 designates Analog Input pin AN16.

Referring now also to FIG. 1, with MUX field equal to 01 (i.e. one external MUX), one of the inputs into MUX 10 (AN16, AN18, AN20, AN22, AN24, AN26, AN28, or AN30) is selected and coupled into pin ANx by the appropriate CHAN field value 1XXX0. For example, CHAN field 10000 selects input AN16; CHAN field 10010 selects input AN18; and so on.

With MUX field equal to 10 (i.e. two external MUX's), the appropriate input to MUX 10 is selected and coupled into pin ANx by the appropriate CHAN field value 1XXX0, as mentioned immediately above, and, in addition, one of the inputs into MUX 12 (AN17, AN19, AN21, AN23, AN25, AN27, AN29, or AN31) is selected and coupled into pin ANy by the appropriate CHAN field value 1XXX1. For example, CHAN field 10001 selects input AN17; CHAN field 10011 selects input AN19; and so on.

With MUX field equal to 11 (i.e. three external MUX's), the appropriate inputs to MUX's 10 and 12 are selected and coupled into pins ANx and ANy, respectively, as mentioned immediately above, and, in addition, one of the inputs into MUX 14 (AN8, AN9, AN10, AN11, AN12, AN13, AN14, or AN15) is selected and coupled into pin ANz by the appropriate CHAN field value 01XXX. For example, CHAN field 01000 selects input AN8; CHAN field 01001 selects input AN9; and so on.

For all external multiplexer modes, three of the internally multiplexed pins (AN18, AN20, and AN22) become multiplexer address outputs MA0, MA1, and MA2, respectively.

FIG. 9 shows that either three, two, one, or no external multiplexers can be used, and that the use of the I/O pins varies. The channel numbers used by the host system software in the CCW's varies too with the different multiplexing modes. It will be apparent to one of ordinary skill in the art that the herein-disclosed method of sampling external MUX's may be utilized with MUX's with fewer or more analog input pins, and that the number of MUX's may be varied.

FIG. 10 is a table which shows the number of analog channels available with different numbers of external multiplexer chips for the various implementations possible, in terms of the number of I/O pins allocated to the QADC module 1. For example, in the 18-pin version, a total of fourteen analog channels are available with no external MUX chips; eighteen analog channels are available with one external MUX chip; twenty-five analog channels are available with two external MUX chips; etc.

Simultaneous Sampling

Simultaneous sampling may be used for receiving and converting differential or other special signal pairs. The QADC allows two adjacent analog input channels, identified by ignoring the lowest-order bit of the CHAN field in the CCW, to be sampled at the same time. Two adjacent analog channels are always sampled simultaneously, but only one is converted with each CCW. To convert a simultaneous analog sample from the second channel, the CCW inhibits re-sampling in the next CCW.

Input Sample Time

The sample time may be altered through host system software control. Different analog signal source impedances may thus be used. Allowing higher source impedances can eliminate the cost of an external amplifier. The trade-off is a longer sample time.

By host system software selection, the system clock and prescaler output (based on the system clock) are used as a time base (an on-chip RC oscillator might also be used as a time base). One input sample time is the default minimum, and the other sample time is programmed by the host system software. The default sample time is a specified number of clock cycles for the first conversion of a sequence and is the A/D conversion time for subsequent channels in a conversion queue. When the default sample time is too fast, the host system software can specify a longer sample time, and that sample time is programmable for up to 128 QADC clock cycles in a preferred embodiment.

Alternate Reference Inputs

There are two sets of reference pins for A/D conversion. Each analog channel may be referenced to either the primary or alternate pair of reference voltages. The primary reference pins are $V_{RH0}$ and $V_{RL0}$, and the alternate reference pins are $V_{RH1}$ and $V_{RL1}$. The alternate reference pins also may be input channels when not needed as references, or they can be converted to compare or calibrate the reference levels. Note that the reference pins may be separated from the supply pins in some implementations or shared with them in other implementations.

A/D Result Data Format Options

FIG. 11 illustrates the data format options of Result Words stored in the Conversion Result Table. The QADC 1 includes a table of Conversion Result Registers, readable in any of at least three data format options for each Result Word.

One option is with the 10-bit result right-justified in the 16-bit word, with zeros in the higher order unused bits. Another choice is a left-justified result with zeros in the lower order unused bits. The third option is a left-justified result with the most significant bit inverted and with zeros in the unused lower order bits. This third option corresponds to a "half-scale, offset binary, twos-complement" data format, which is useful in digital signal processing applications. Another option, not implemented in the embodiment illustrated herein, is a right-justified, signed format. In addition, a right-justified, sign-extended format (with leading 0's or 1's, depending upon the sign) could be provided.

Figure 22B:
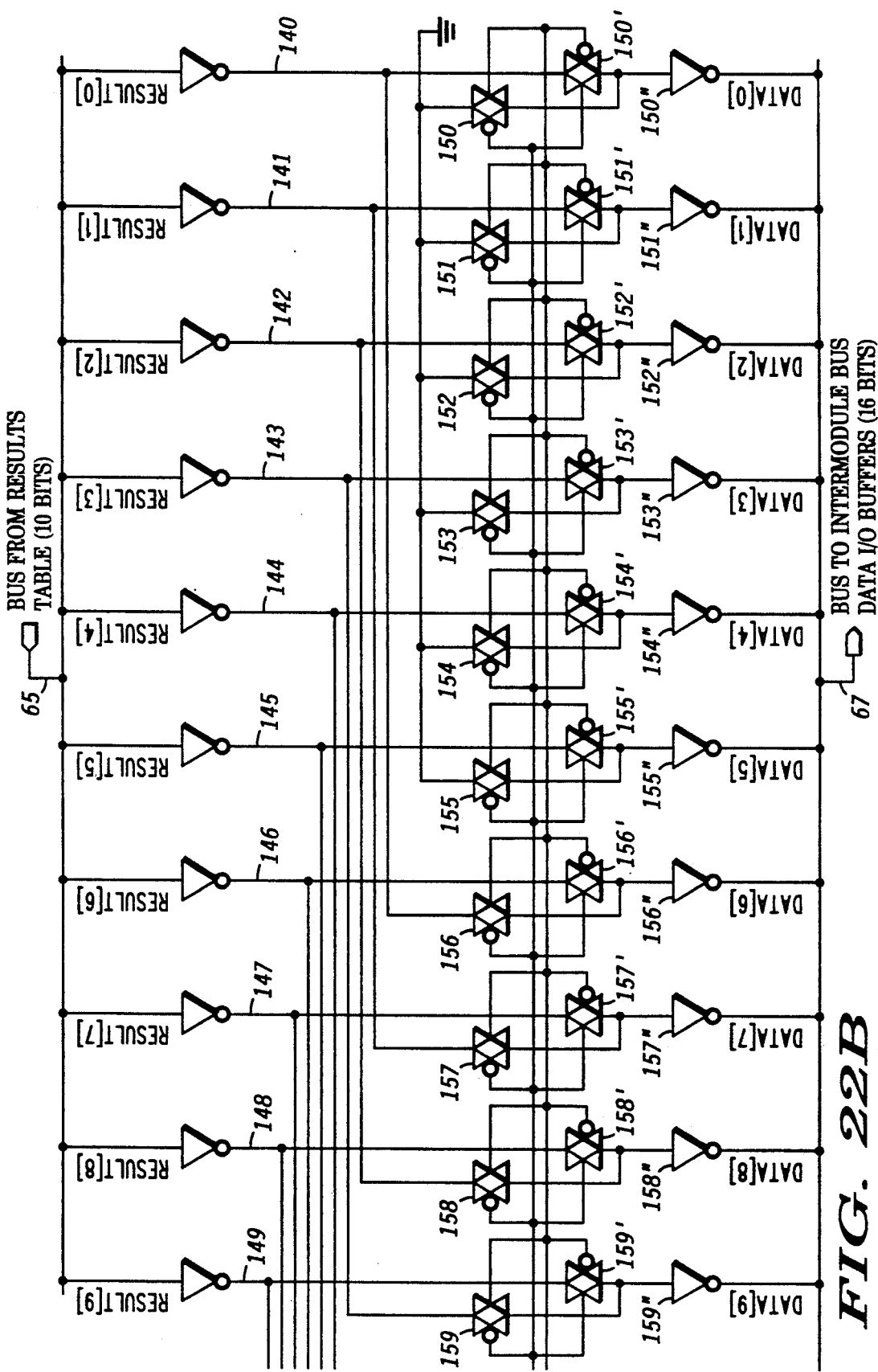

The Conversion Result Registers are 10 bits wide. In the present embodiment the remaining six bits of each 16-bit word are not implemented. The result data formatting is produced during host system software read operations, since the address range where the results are read is used to select the desired data format. Refer to FIGS. 21 and 22, and the accompanying description below under the heading "Result Word Format Options", for further information concerning the various data format options.

Write operations, including read-modify-write instructions like bit manipulation, do not access a true 16-bit value. Since the 10-bit result is stored in a 10-bit register or memory word, 6 bits are saved, thereby reducing the silicon area of the integrated circuit.

Register Descriptions

This section discusses the detailed formats of the control, status, digital port, and CCW information that the host system software provides to the QADC and obtains from the QADC. Four types of word format are discussed in the following subsections. First are the control words that the host system software provides to configure and initialize the QADC module. Second are the digital data ports. Third is a status word that the host system software reads to determine the current operation of the QADC, including interrupt flags. Last is the Conversion Command Word for each A/D conversion that is obtained from the CCW queue.

Module Configuration Register (MCR)

FIG. 12 shows the format of the Module Configuration Register of the A/D converter module.

The Module Configuration Register includes initialization information from the host system software to the QADC. This information is typically set up once on power-up and not changed during normal operation, though it may be changed when needed. Included are stand-by mode selection, supervisor space selection, and interrupt arbitration.

STOP—Stop Mode (Bit Position: 15)

Function: Stop mode select (stop clocks, power down analog circuits)
Reset State: STOP=0

The host system software can disconnect the clock signal to the A/D converter and power down the analog circuits to reduce power. When set, the STOP bit aborts any conversion sequence in progress. Because the bias currents to the analog circuits are turned off, the QADC module requires some recovery time to stabilize the analog circuits after clearing the STOP bit.

FRZ—Freeze Enable (Bit Position: 14)

Function: Freeze Enable (suspend module operation)
Reset State: FRZ=0

When debugging an application, it is useful in many cases to have the QADC module pause when a breakpoint is encountered. When FRZ=1 and the IMB's IFREEZEB signal is asserted, the current conversion is aborted, and the queue is left in a mode noting that it needs service. The QADC clock is stopped so that the periodic timer is not advancing either. Any external trigger events that occur during the freeze mode are not recorded. When the IMB's IFREEZEB signal is negated, conversions begin again at the top of the queue. If neither queue is awaiting service when the freeze mode is exited, the module waits for an appropriate queue trigger to occur.

SUPV Supervisor Space (Bit Position: 7)

Function: Supervisor space selection
Reset State: SUPV=1

Some host CPU's and software systems permit two addressable spaces: unrestricted space accessible to any software, and supervisor space which is accessible only from system software (the operating system). Other host CPU's do not include this option and are thus always in the supervisor mode from the vantage point of the QADC. The first three register word locations in the RAM register table (80, FIGS. 4 and 5), which are the Module Configuration Register, Test Register, and Interrupt Register, are always in the supervisor space. The remaining Control, Status, and Port registers are programmable via the SUPV bit.

FIG. 13 illustrates the use of the SUPV bit of the Module Configuration Register of the QADC. When SUPV=1, all QADC Status, Control, and Port registers are accessible only in the Supervisor mode. When SUPV=0, they may be accessed in either the Supervisor or unrestricted modes. When the QADC is used with a host CPU that does not support Supervisor/unrestricted modes, the state of the SUPV bit is unimportant.

IARB Interrupt Arbitration Number (Bit Position: 0-3)

Function: Define interrupt arbitration priority number
Reset State IARB=0001

Figure 14:
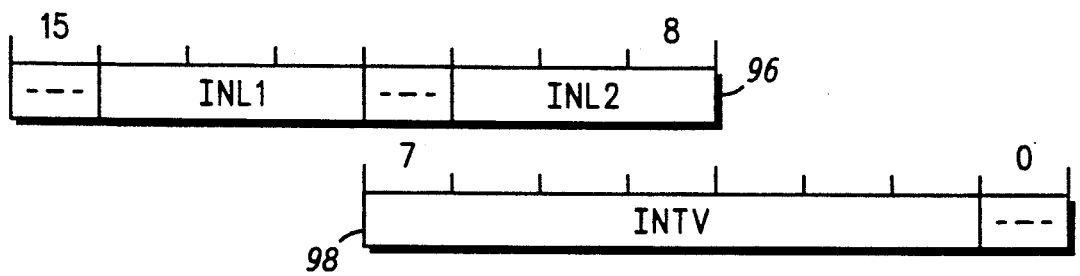
FIG. 14 shows the format of the Interrupt Register of the A/D converter module.

Within the QADC, the interrupt level is assigned to each interrupt source via the Interrupt Register (FIG. 14). Since multiple IMB modules could request an interrupt on each interrupt level, the priority of the interrupt within the assigned level is established with the IARB field.

Once the host CPU begins to process an interrupt request at a particular level, an arbitration cycle determines which interrupt is to be served of those requesting on that level. The 0000 state of IARB is not valid, leaving up to 15 IMB modules that can arbitrate for interrupt service. The lowest priority is 0001 and the highest is 1111.

It is the responsibility of the initialization host system software to ensure that the seven bits that establish the interrupt level and priority (INL1 and INL2, plus IARB) are unique throughout the entire system. Successful interrupt arbitration depends on no two interrupts causing the same level and priority to be used on the Intermodule Bus (IMB).

Test Register

The Test Register controls various test modes which are used during manufacturing, and is not intended to be used in a normal application. The Test Register can only be written in the test mode, when the ITSTMODB line on the IMB is asserted. In the non-test mode the Test Register can only be read, but writes have no effect.

Interrupt Register

The Intermodule Bus (IMB) requires three things to fully identify an interrupt request. First, the request must be asserted on one of seven levels. Since the QADC module has two separate interrupt request sources, two 3-bit software-provided parameters establish the request level for each source. Then, one of 15 possible priorities within that level is determined by an arbitration process on the IMB. The QADC includes 4-bits in the Module Configuration Register for the arbitration priority. Third, an 8-bit vector number is provided on the IMB to identify the software entry point for each interrupt source.

FIG. 14 shows the format of the Interrupt Register of the A/D converter module.

INL1—Interrupt Level 1 (Bit Position: 12-14)

Function: Define Queue 1 interrupt level
Reset State: INL1=000

Three bits are used for the host system software to assign the Queue 1 Completion Interrupt to one of seven interrupt levels. The 000 state disables the interrupt. Level 001 is the lowest priority interrupt level, and level 111 is the highest. The QADC uses the level number to determine which of seven interrupt requests to the host CPU is to be asserted. The host CPU permits the interrupt to occur when there are no other interrupts at a higher level. Up to 15 different interrupts can be assigned by the host system software to a particular interrupt level, provided that each is assigned a unique interrupt priority.

INL2—Interrupt Level 2 (Bit Position: 8-10)

Function: Define Queue 2 interrupt level
Reset State: INL2=000

Three bits are used for the host system software to assign the Queue 2 Completion Interrupt to one of seven interrupt levels. The 000 state disables the interrupt. Level 001 is the lowest priority interrupt level, and level 111 is the highest. The QADC uses the level number to determine which of seven interrupt requests to the host CPU is to be asserted. The host CPU permits the interrupt to occur when there are no other interrupts at a higher level. Up to 15 different interrupts can be assigned by the host system software to a particular interrupt level, provided that each is assigned a unique interrupt priority.

INTV—Interrupt Vector Number (Bit Position: 0-7)

Function: Define interrupt vector
Reset State: $0F

The Interrupt Vector Number is established by the host system software. The QADC uses two interrupt vectors, one for each of the CCW queues. Therefore, the host system software writes the high order seven bits of the Interrupt Vector Number into the QADC Interrupt Register. The QADC provides the eighth bit back to the host CPU during a bus IACK (interrupt acknowledge) cycle.

An interrupt from CCW Queue 1 completion returns an interrupt vector of binary xxxx xxx0, where xxxx xxx is the INTV field. An interrupt from a CCW Queue 2 completion causes the returned vector to be xxxx xxx1. The vector number identifies the place in memory where the host CPU obtains the program counter for the interrupt routine. The Interrupt Vector Number is independent of the interrupt level and arbitration priority.

Port Data Register

All QADC pins that are not needed for their analog inputs, external trigger inputs, or external multiplexer interfacing, can also be used as digital port pins. The following descriptions refer to the highest pin-count version of the module, operating in the internally multiplexed mode. With the versions that implement fewer pins, the full width of the digital ports is not available.

Figure 15:
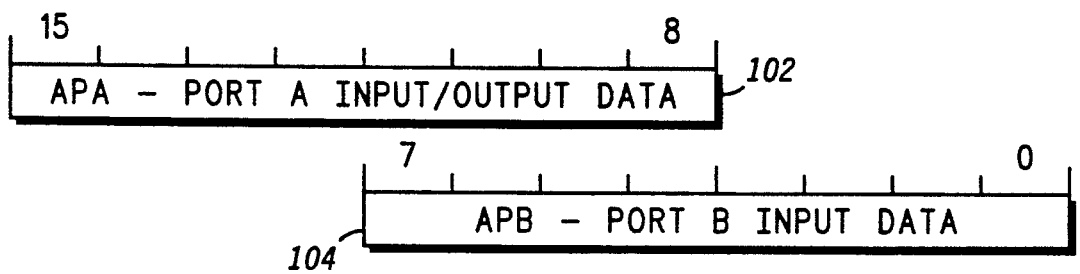
FIG. 15 shows the formats of the Port A and Port B Data Registers of the A/D converter module.

FIG. 15 shows the formats of the 8-bit Port A and Port B Data Registers of the A/D converter module.

Port A Data Registers (Bit Position: 8-15)

Function: Input/output data register

Port A is a bi-directional 8-bit I/O port that may be used for general purpose digital input or output signals.

Port B Data Register (Bit Position: 0-7)

Function: Input data register

Port B is an input-only 8-bit digital port that may be used for general purpose digital input signals.

Port Data Direction Register

The Data Direction Register (DDR) associated with a digital I/O port establishes whether each bi-directional pin is an input or an output.

Figure 16:
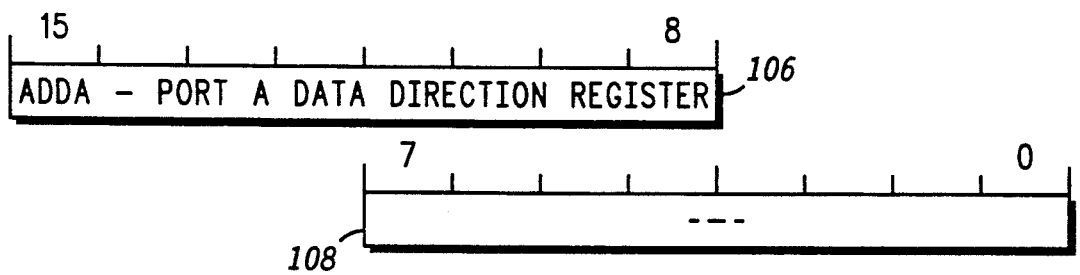
FIG. 16 shows the format of the Port A Data Direction Register of the A/D converter module.

FIG. 16 shows the format of the Port A Data Direction Register of the A/D converter module.

Port A Data Direction Register (Bit Position: 8-15)

Function: Establish Port A pin functions as input or output
Reset State: $00

In the maximum pin-count configuration, all eight bits of Port A are bi-directional. The Data Direction Register bits associated with each pin establish whether the pin handles an input or an output signal. On power-up, the Data Direction Register is reset, and all port pins are inputs. The host system software selects a pin to be a driven output signal by writing a binary one into the Data Direction bit for the pin. When the DDR establishes a pin to be an output, a host system software read of the Port A Data Register obtains the state of the output port data register, not the actual pin, in order to permit read-modify-write instructions.

Control Register 0

Figure 17:
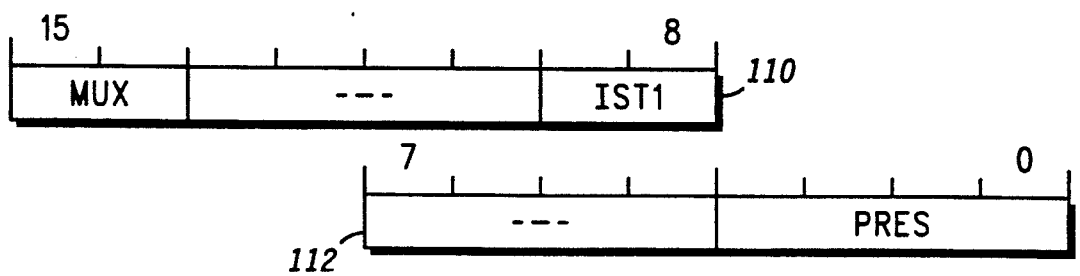
FIG. 17 shows the format of Control Register 0 of the A/D converter module.

FIG. 17 shows the format of Control Register 0 of the A/D converter module.

Control Register 0 includes initialization information for the entire converter, not just one of the CCW queues. Some of the control fields in this word establish parameters that are referenced by the CCW.

MUX External Multiplexed Modes (Bit Position: 14, 15)

Function: Enable externally multiplexed channel selection
Reset State: 00

The host system software can enable an expansion of the number of channels by setting the MUX mode. When MUX=00, a maximum of 16 channels are available. MUX=01, enables expansion with one external multiplexer chip.

In each of the external multiplexed modes, the PA0, PA1, and PA2 pins become multiplexed address output pins (MA0, MA1 and MA2), thereby out-putting three bits from the 5-bit CHAN field of the CCW. The PB1 pin becomes the multiplexed channel analog input pin, ANx.

MUX=10 enables the expansion for two external multiplexers. In this mode, PB2 becomes the additional multiplexed analog input pin, ANy. The ANx pin is used for all even channels in the range of 16-30. Similarly, the ANy pin, serves all odd channels in the range of 17-31. These two inputs may serve as a pair, thus extending the simultaneous sample function to the externally multiplexed channels.

MUX=11 enables the expansion for three external multiplexers. In this mode, the PB3 pin becomes the additional multiplexed channel analog input pin, ANz. The main use for this mode is when only 10 to 14 pins can be allocated to the QADC module on the overall integrated circuit of which it is a part.

The following table summarizes the four states of the MUX field:
MUX=00 Internally multiplexed, 16 possible channels
MUX=01 Externally multiplexed (1 Unit), 20 possible channels
MUX=10 Externally multiplexed (2 Units), 27 possible channels
MUX=11 Externally multiplexed (3 Units), 27 possible channels, plus digital port pins IST1 Input Sample Time (Bit Position: 8,9)

Function: Select input sample time for CCW IST bit=1
Reset State: 00

For channels connected to higher source impedances, a longer sample time is required to ensure conversion accuracy. Other signals need to be converted as quickly as possible. The IST bit in the CCW selects which of two sample times are to apply to that conversion. When the CCW IST=1, the two IST1 bits in Control Register 0 establish the input sample time. There are four selectable input sample times in the present embodiment:

| | |
|---|---|
| IST1 = 00 | Input Sample Time = Tadcck × 16 |
| IST1 = 01 | Input Sample Time = Tadcck × 32 |
| IST1 = 10 | Input Sample Time = Tadcck × 64 |
| IST1 = 11 | Input Sample Time = Tadcck × 128 |

PRES Prescaler (Bit Position: 0-4)

Function: Define IMB System Clock to QADC Operating Clock ratio.
Reset State: 1111

The QADC Operating Clock Time (Tadcck) is the time-base for all A/D conversion functions, including the input sample time, the conversion time, and the periodic timer. The pre-scaling is between the IMB System Clock (Iclock signal) and the Tadcck internal clock of the QADC module. The prescaler must be host system software programmed so that its output frequency falls within the Tadcck tolerance.

In order to permit wide selection of the System Clock (Tclock) frequency, the QADC prescaler is modulus-programmable. A 4-bit modulus prescaler, followed by a divide-by-two stage to ensure clock symmetry, multiplies the System Clock period by from 2 to 30, in even integer increments, as shown in the following table:

| | Operating Clock Time |
|---|---|
| PRES = 0000 | QADC Clock Time (Tadcck) = Tclock × 2 |
| PRES = 0001 | QADC Clock Time (Tadcck) = Tclock × 4 |
| PRES = 0010 | QADC Clock Time (Tadcck) = Tclock × 6 |
| PRES = 0011 | QADC Clock Time (Tadcck) = Tclock × 8 |
| PRES = 0100 | QADC Clock Time (Tadcck) = Tclock × 10 |
| to | |
| PRES = 1101 | QADC Clock Time (Tadcck) = Tclock × 28 |
| PRES = 1110 | QADC Clock Time (Tadcck) = Tclock × 30 |
| PRES = 1111 | QADC Clock Time (Tadcck) = Tclock × 32 |

Control Register 1

Figure 18:
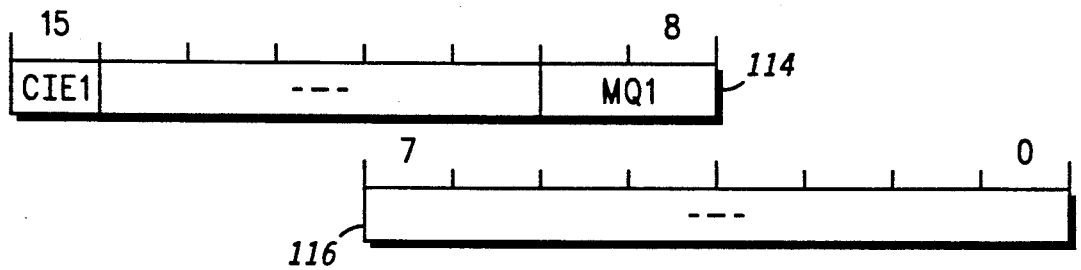
FIG. 18 shows the format of Control Register 1 of the A/D converter module.

FIG. 18 shows the format of Control Register 1 of the A/D converter module.

Control Register 1 is the Mode Control Register for the operation of Queue 1. The host system software establishes the operating mode of the queue servicing logic. One key purpose is to establish the criteria for beginning a conversion sequence with the first CCW in the queue. The first conversion can be initiated by an external signal, or by host system software command. Control Register 1 also allows the host system software to enable a Conversion Complete Interrupt.

CIE1—Completion Interrupt Enable 1 (Bit Position: 15)

Function: Enable interrupt upon completion of Queue 1
Reset State: 0

CIE1=0 disables the Conversion Complete Interrupt associated with Queue 1. CIE1=1 enables an interrupt after the last conversion of a Queue 1 CCW sequence. The last conversion in the sequence is identified when the CCW pointer is at the beginning of Queue 2, an end-of-queue code is encountered in the CHAN field of the CCW, or the end of the queue RAM is reached.

MQ1—Mode. Queue 1 (Bit Position: 8,9)

Function: Select the operating mode for Queue 1
Reset State: 00 (binary)

Two bits establish the operating mode of Queue 1 in the CCW Table. These bits are written to Control Register 1 by the host system software. The only case when they are modified by the QADC is the Software Initiated mode, where the mode is changed to the disabled state after one conversion sequence. When there are active CCW's in Queue 1 awaiting service by the analog subsystem (sample and hold, and A/D converter), they have priority over any pending CCW's in Queue 2. The mode selected for MQ1 and the channels assigned to Queue 1 are thus the high priority A/D conversions. Therefore, Queue 1 does not include a continuous mode, since this would preclude the operation of Queue 2.

The following summarizes the operating modes of Queue 1:
MQ1=00 Disabled, no conversions
MQ1=01 Software initiated, starts conversion sequence with the act of loading 01 into MQ1
MQ1=10 External trigger 1, positive edge starts conversion sequence
MQ1=11 External trigger 1, negative edge starts conversion sequence.

Control Register 2

Figure 19:
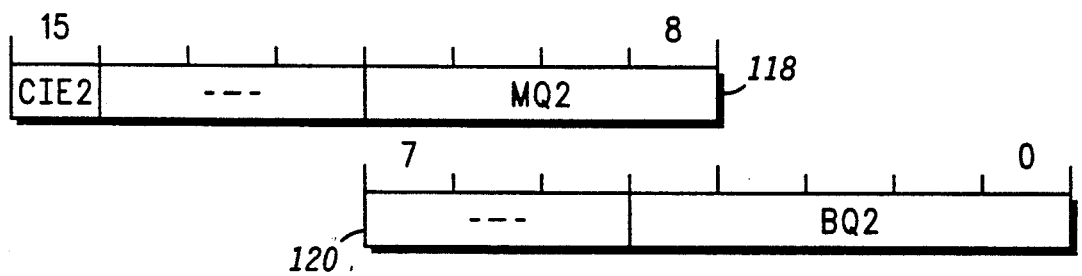
FIG. 19 shows the format of Control Register 2 of the A/D converter module.

FIG. 19 shows the format of Control Register 2 of the A/D converter module.

Control Register 2 is the Mode Control Register for the operation of the CCW's in Queue 2. The host system software establishes the operating mode of the queue servicing logic, that is, the criteria for beginning a conversion sequence with the first CCW in Queue 2. The first conversion can be initiated by host system software command, at regularly timed intervals, immediately after the last sequence is completed (the continuous mode), or when an external trigger occurs.

CIE2—Completion Interrupt Enable 2 (Bit Position: 15)

Function: Enable interrupt upon completion of Queue 2
Reset State: 0

CIE2=0 disables the Conversion Complete Interrupt associated with Queue 2. CIE2=1 enables an interrupt after the last conversion of a Queue 2 CCW sequence. The last conversion in the sequence is identified when the CCW index pointer is at the last location of the table or the CCW CHAN field is the end-of-queue code.

MQ2 Mode. Queue 2 (Bit Position: 12-14)

Function: Select the operating mode for Queue 2
Reset State: 0000 (binary)

Four bits establish the operating mode of Queue 2 in the CCW Table. These bits are written to Control Register 2 by the host system software. The only case when they are modified by the QADC is the Software Initiated mode, where the mode is changed to the disabled state after one conversion sequence. When there are active CCW's in Queue 1 awaiting service by the analog subsystem (sample and hold, and A/D converter), they. have priority over any pending CCW's in Queue 2. The mode selected and the channels assigned to Queue 2 should thus be the lower priority A/D conversions.

With prior art A/D converters integrated into microcontroller units, a common software usage is for a periodic interrupt (real-time clock interrupt) routine to initiate an A/D conversion sequence. The QADC includes a periodic timer to keep the host system software from having to initiate a conversion scan. The MQ2 field selects the periodic mode and establishes the time interval.

|  | Periodic Timer Interval |
|---|---|
| MQ2 = 0000 | Disabled, no conversion |
| MQ2 = 0001 | Software initiated, start conversion sequence with the act of loading 0001 into MQ2 |
| MQ2 = 0010 | External trigger 2, positive edge starts conversion sequence |
| MQ2 = 0011 | External trigger 2, negative edge starts conversion sequence |
| MQ2 = 0100 | Continuous mode |
| MQ2 = 0101 | Periodic timer interval = Tadcck × 128 |
| MQ2 = 0110 | Periodic timer interval = Tadcck × 256 |
| MQ2 = 0111 | Periodic timer interval = Tadcck × 512 |
| MQ2 = 1000 | Periodic timer interval = Tadcck × 1024 |
| MQ2 = 1001 | Periodic timer interval = Tadcck × 2048 |
| MQ2 = 1010 | Periodic timer interval = Tadcck × 4096 |
| MQ2 = 1011 | Periodic timer interval = Tadcck × 8192 |
| MQ2 = 1100 | Periodic timer interval = Tadcck × 16384 |
| MQ2 = 1101 | Periodic timer interval = Tadcck × 32768 |
| MQ2 = 1110 | Periodic timer interval = Tadcck × 65536 |
| MQ2 = 1111 | Periodic timer interval = Tadcck × 131072 |

BQ2 Beginning of Queue 2 (Bit Position: 0-4)

Function: Indicates the CCW address where Queue 2 begins
Reset State: 11111

To allow the length of Queue 1 and Queue 2 to vary, a pointer initialized by the host system software is used to identify the CCW table location where Queue 2 begins. BQ2 is used to detect the end of Queue 1, as well as the initial position for Queue 2. If Queue 2 is interrupted by the higher priority Queue 1, Queue 2 automatically restarts at its top location after Queue 1 is completed.

Status Register

The Status Register may be read by the host system software and contains information associated with the conversion queues and the overall QADC module.

Figure 20:
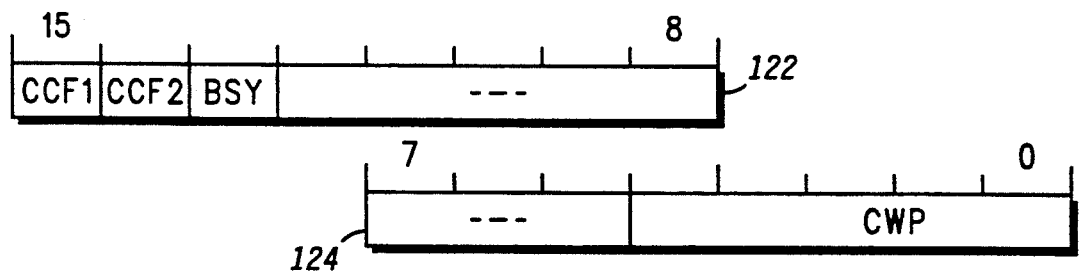
FIG. 20 shows the format of the Status Register of the A/D converter module.

FIG. 20 shows the format of the Status Register of the A/D converter module.

CCF1—Conversion Complete Flag 1 (Bit Position: 15)

Function: Indicates Queue 1 conversion sequence completion
Reset State: 0

The Conversion Complete Flag 1 is set by the QADC when the last conversion of Queue 1 is finished. CCF1 is a status bit that is available to the host system software whether or not the corresponding interrupt is enabled. When CCF1=1, the interrupt is enabled (CIE1=1), and the interrupt level field (INL1) is a non-zero value, the QADC creates an interrupt request to the host CPU using the level (INL1) in the Interrupt Register, the priority (IARB) in the Module Configuration Register, and the vector number (INTV) in the Interrupt Register. The CCF1 flag is cleared back to zero when it is written to zero and it was a one when last read.

CCF2—Conversion Complete Interrupt Flag 2 (Bit Position: 14)

Function: Indicates Queue 2 conversion sequence completion
Reset State: 0

The Conversion Complete Flag 2 is set by the QADC when the last conversion of Queue 2 is finished. CCF2 is a status bit that is available to the host system software whether or not the corresponding interrupt is enabled. When CCF2=1, the interrupt is enabled (CIE2=1), and the interrupt level field (INL2) is a non-zero value, the QADC creates an interrupt request to the host CPU using the level (INL2) in the Interrupt Register, the priority (IARB) in the Module Configuration Register, and the vector number (INTV) in the Interrupt Register. The CCF2 flag is cleared back to zero when it is written to zero and it was a one when last read.

BSY—Busy (Bit Position: 13)

Function: Indicates a sample/hold or conversion in progress.
Reset State: 0

When a CCW from Queue 1 or Queue 2 is in the process of being served by the sample and hold and/or the A/D converter, the BSY status bit is set to a one. When the analog subsystem is not actively serving either queue, the status bit is a zero.

CWP—Command Word Pointer (Bit Position: 0-4)

Function: Indicates the address of the current or last CCW to execute
Reset State: 00000 (binary)

The Conversion Command Word (CCW) table length is 32 words long. A 5-bit status field is included to allow the host system software to see which CCW is executing at present or was last completed. The host system software can thus monitor progress of a conversion sequence. When the converter is busy, the CWP shows the CCW being served. When not busy, CWP indicates the last CCW that was completed.

Conversion Command Word

The entries in the Conversion Command Word (CCW) table are 8-bit CCW's. The CCW is written by the host system software and is not modified by the QADC. The CCW contains the command bits to take one analog level sample and convert it to a digital result. The low-order bits of the CCW (CHAN, IST and RSI) contain command information for the sample and hold portion of the A/D converter. The REF bit of the CCW specifies the reference pair to use during conversion. The fields of the CCW will now be explained.

REF—Alternate Reference Enable (Bit Position: 7)

Function: Select primary or alternate reference for conversion process
Reset State: Not initialized When the REF bit is a zero, the $V_{RH0}$ pin is used for the high reference level, and $V_{RL0}$ pin is used for the low reference level for the conversion. When the REF bit is set to one, the alternate high and low reference voltages, $V_{RH1}$ and $V_{RL1}$, are used instead.

RSI—Re-Sample Inhibit (Bit Position: 6)

Function: Inhibits re-sample of analog input for simultaneous sampling
Reset State: Not initialized In normal operation (RSI=0), two adjacent channels are sampled simultaneously, but only the one indicated by the CCW CHAN field is converted. When the user wishes to convert the simultaneously sampled adjacent channel, the RSI bit of the CCW is set to a one, to inhibit re-sampling. The lowest order bit of the CHAN field acts as a toggle between the two channels selected by the higher order bits in the CHAN field. Channel 1 cannot be simultaneously sampled since it is paired with channel 0, which is the code for the last CCW.

IST—Input Sample Time (Bit Position: 5)
Function: Selects one of two input sample times
Reset State: Not initialized When the IST bit in the CCW is a 0, one of two default input sample times is used. For the first conversion of a sequence (the first CCW in Queue 1 and Queue 2), the default sample time is a few cycles, and for subsequent conversions in the queue, the sample time is the conversion time. When the IST bit in the CCW is a 1, the IST1 field in Control Register 0 is used to select the input sample time.

CHAN—Channel Number (Bit Positions 0-4)
(Function: Select input channel number)
Reset State: Not initialized The CHAN bits select which analog input signal is connected to the A/D converter. When the MUX bits in Control Register 0 are clear, the QADC module is in the internally multiplexed mode. In this mode, the five CHAN bits enable the QADC to select up to 16 input channels, depending on the module version, plus internal test channels, as shown in FIG. 9. For micro-controller implementations with fewer than 16 external channels, the unconnected pins are connected to $V_{DDA}/V_{RH0}$ or $V_{SSA}/V_{RLO}$.

When the MUX bits in Control Register 0 are not 00, one of the externally multiplexed modes is in use. The five CHAN bits are re-mapped, so that some of the channel numbers are externally multiplexed. The table in FIG. 9 shows the definition for the CHAN channel numbers for each multiplexing mode.

One of the CHAN words (CHAN=00000) is used as an end-of-queue indication instead of a multiplexed input channel. When the control logic encounters this end-of-queue code in the CCW table, no further conversions are performed on that scan through the queue.

In addition, as mentioned above, the CCW may include one or more optional control fields if desired. For example, a field may specify the converter resolution if different converter resolutions need to be accommodated. Another field may be used to designate the data result alignment, rather than using the two upper address bits to select the data result alignment in the manner explained immediately below.

While it is a significant advantage of the present invention that sampling and conversion operations can be conducted, once the queues are loaded by the host system software, without further involvement by such software, it is also possible for the host system software to dynamically modify information stored in the queues. This would normally be done only to the lower priority queue (e.g. Queue 2), since the higher priority queue (Queue 1) is normally utilized for high duty cycle operations on relatively fast changing signals.

One purpose in modifying the Queue 2 control information is to designate the periodic sampling and conversion of analog signals which typically change relatively slowly compared to those being sampled and converted under the control of Queue 1.

Result Word Format Options

FIG. 21 illustrates the addresses (i.e., absolute addresses, where "x" represents an arbitrary base address of the QADC module) required to read Result Words stored in the Conversion Result Table in at least three different data format options. The addresses are $XA0, $XA2, $XA4, etc., through $XDE for the thirty-two result words RSLT0 through RSLT31, respectively, in the right-justified, unsigned format.

The addresses are $X120, $X122, etc., through $X15E for the thirty-two result words RSLT0 through RSLT31, respectively, in the left-justified, signed format.

And the addresses are $X1A0, $X1A2, etc., through $X1DE for the thirty-two result words RSLT0 through RSLT31, respectively, in the left-justified, unsigned format.

FIG. 22 shows a detailed logic implementation of the Data Format logic 68 shown in FIG. 2. The 10-bit result word is read from the Results Table 64 via 10-bit bus 65, and each bit (RESULT [0] through RESULT[9]) is received by a respective line 140-149.

Two upper address bits are received by the Sign Control 130 and Left/Right Justify Control 132 lines. Lines 130 and 132 are input into NAND gate 134, whose output forms one input into Exclusive OR gate 180.

Left/Right Justify Control line 132 is also coupled via line portion 137 to the non-inverting control terminals of a first series of transmission gates 150-165 and to the inverting control terminals of a second series of transmission gates 150'-165'.

Left/Right Justify Control line 132 is also coupled via line portion 138 to inverter 136, whose output is coupled to the inverting control terminals of the first series of transmission gates 150-165 and to the non-inverting control terminals of the second series of transmission gates 150'-165'.

The input terminals of transmission gates 150'-159' are coupled to RESULT[0]-RESULT[9] lines 140-149, respectively, and their output terminals are coupled to inverters 150"-159", respectively. The input terminals of transmission gates 160'-165' are tied to ground.

The input terminals of transmission gates 156-165 are also coupled to RESULT[0]-RESULT[9] lines 140-149, respectively, and their output terminals are coupled to inverters 156"-165", respectively. The input terminals of transmission gates 150-155 are tied to ground.

The outputs of inverters 150"-164" represent DATA[0] through DATA[14], respectively.

The outputs of transmission gates 165 and 165' are coupled to the second input to Exclusive OR gate 180, whose output is DATA[15].

Outputs DATA[0] through DATA[15] are coupled to a 16-bit bus 67 which in turn is coupled to the Bus Interface Unit 70 and Intermodule Bus 72 (FIG. 2).

In operation, if the Left/Right Justify Control bit is a first value, e.g. a logical "1", transmission gates 150-165 will be turned ON, transmission gates 150'-165' will be turned OFF, and consequently the 10-bit result word RESULT[0]-RESULT[9] will be gated out in a left-justified format through DATA[6]-DATA[15].

On the other hand, if the Left/Right Justify Control bit is a logical "0", transmission gates 150-165 will be turned OFF, transmission gates 150'-165' will be turned ON, and consequently the 10-bit result word RESULT[0]-RESULT[9] will be gated out in a right-justified format through DATA[0]-DATA[9].

The sign control is determined by the logical state of the Sign Control signal over line 130 and by the Left/Right Justify Control signal 132.

The desired data result format may also be specified by host system software loading appropriate control information into the QADC module. For example, format information could be loaded (in the form of one or more bits in a CCW or control register) to specify the desired data result format for each conversion, for a scan sequence or group of conversions, for each channel (as one or more control register bits per pin), or for a group of channels.

Alternative Embodiments

It will be apparent to one of ordinary skill that the present invention can be implemented in many different ways.

For example, the system architecture could be arranged differently. The bus structure to the host processor could be different. The control word queues and result registers could be coupled to the host processor bus rather than associated with the QADC module.

The various control words, tables, and registers could contain more or fewer number of bits and data fields, and they could be arranged in many other ways. The register addresses and bit assignments could be altered.

The control fields can be implemented in different control words. For instance, the MUX field in Control Word 0 could be implemented within a different control word, such as the Module Configuration word in Module Configuration Register (FIG. 6).

The CCW table 62 could be a ROM. It could also be a single register storing a CCW containing control information to control the desired conversion process, e.g. all channels in a specified sequence.

The number of input analog pins could be fewer or more. The number of channels could be expanded by employing a larger channel field (CHAN) in the CCW. Pin assignments and functions and channel numbers (FIG. 9) could be altered.

The converter resolution could include more or fewer bits or could be selectable via a data field in a control word.

The queue lengths could be longer or shorter, and there could be more or fewer queues, including a queue only one CCW long. There could be more or fewer queue-initiating modes on each queue. There are a variety of ways for identifying the beginning and end of each queue.

There could be fewer or more data result formats, and, as mentioned above, there are a variety of other ways to select which data result format applies to each conversion, group of conversions, channel, or group of channels.

All of the conversion initiation methods (external trigger, periodic interval, continuous, software initiated), and most of the rest of the QADC features, can be applied to an A/D module that does not use a CCW queue to schedule the channels to be converted.

There can be more or less versatility regarding the selection of the input sample time.

There are other ways to convert two simultaneously sampled channels, and the selection of which channels and how many channels are to be sampled simultaneously can be more or less versatile.

The selection of which reference pins are to be used can be more or less versatile.

The power pins, reference pins, external trigger pins, and external MUX interface pins could be separate or shared with the analog input signals. The MUX addressing signals and MUX analog inputs need not necessarily be transmitted on pins also functioning as analog input channels.

The number of external multiplexers could be altered. Other variations to the module definition could affect the MUX function.

The channel selection need not be performed by a CCW in a queue. A sequential scan of the channel numbers could also be used.

Control signals in addition to the MUX addressing signals used in the Queued A/D Converter module could also be used, such as an "enable" signal on an external MUX.

The interrupt structure could be less or more versatile. For example, instead of restarting the lower priority queue at its beginning after the higher priority queue has completed its conversion sequence, the lower priority queue could be resumed with the next CCW in its sequence.

The clock source and prescaler selection could be more or less versatile.

The periodic timer rate selection could be more or less versatile, and there could be more than one selectable rate.

The external trigger could originate from another module of the same I.C. It need not be an external pin.

The CCW (FIG. 7) could contain more or fewer parameters to specify the characteristics of each sample, hold, and conversion.

One or more bits in each CCW could be utilized to designate the data format. For example, bits could be provided for resolution (result size) or for result data format, such as left/right justification and signed/unsigned data.

In addition, one or more bits in each CCW could be utilized to designate the sample time.

Accordingly, it is intended by the appended claims to cover all modifications of the invention which fall within the true spirit and scope of the invention.

What is claimed is:

1. An analog-to-digital conversion system for use with at least one multiplexer circuit having a plurality of data input terminals, at least one address input port, and at least one data output port, said conversion system comprising:
   (a) an analog-to-digital circuit comprising:
      (i) a control register comprising a control field for holding a control word, said control word having at least a first state and a second state;
      (ii) a first terminal connectable to said address input port of said multiplexer, said first terminal functioning as a data input channel when said control word is in said first state, and said first terminal functioning as an address output channel when said control word is in said second state; and (iii) a second terminal connectable to said data output port of said multiplexer, said second terminal functioning as a data input channel when said control word is in said first state, and said second terminal functioning as a multiplexed data input channel when said control word is in said second state.

2. The analog-to-digital conversion system recited in claim 1, wherein said first terminal functions as either an analog or digital data input channel when said control word is in said first state, and said second terminal functions as an analog data input channel when said control word is in said first state.

3. The analog-to-digital conversion system recited in claim 1, wherein said analog-to-digital circuit and said multiplexer circuit are integrated circuits.

4. An analog-to-digital conversion system comprising:
   (a) an analog-to-digital circuit comprising:
      (i) a control register comprising a control field for holding a control word, said control word having at least a first state and a second state;
      (ii) a first terminal, said first terminal functioning as a data input channel when said control word is in said first state, and said first terminal functioning as an address output channel when said control word is in said second state;
      (iii) a second terminal, said second terminal functioning as a data input channel when said control word is in said first state, and said second terminal functioning as a multiplexed data input channel when said control word is in said second state; and
   (b) a multiplexer circuit having a plurality of data input terminals, at least one address input port coupled to said first terminal, and at least one data output port coupled to said second terminal.

5. The analog-to-digital conversion system recited in claim 4, wherein said first terminal functions as either an analog or digital data input channel when said control word is in said first state, and said second terminal functions as an analog data input channel when said control word is in said first state.

6. The analog-to-digital conversion system recited in claim 4, wherein said analog-to-digital circuit and said multiplexer circuit are integrated circuits.

7. An analog-to-digital conversion system for use with at least one multiplexer circuit having a plurality of data input terminals, at least one address input port, and at least one data output port, said conversion system comprising:
   (a) an analog-to-digital integrated circuit comprising:
      (i) a plurality of analog input terminals;
      (ii) means for reading a plurality of conversion command words in the form of a queue defining a conversion sequence;
      (iii) sampling means responsive to said plurality of conversion command words in said queue to sample, in turn, an analog signal on each of a plurality of corresponding analog input terminals;
      (iv) analog-to-digital converter means responsive to said sampling means for converting the sampled value of said analog signal into a digital value;
      (v) means responsive to said converter means for storing said digital value;
      (vi) a control comprising a control field for holding a control word, said control word having at least a first state and a second state;
      (vii) a first terminal connectable to one of said address input ports of said multiplexer, said first terminal functioning as a data input channel when said control word is in said first state, and said first terminal functioning as an address output channel when said control word is in said second state; and
      (viii) a second terminal connectable to one of said data output ports of said multiplexer, said second terminal functioning as a data input channel when said control word is in said first state, and said second terminal functioning as a multiplexed data input channel when said control word is in said second state.

8. The analog-to-digital conversion system recited in claim 7, wherein said sampling means is responsive to said plurality of conversion command words in said queue to take multiple samples of an analog signal on one of said plurality of analog input terminals.

9. The analog-to-digital conversion system recited in claim 7, wherein said sampling means is responsive to said plurality of conversion command words in said queue to take multiple samples of analog signals on said plurality of analog input terminals.

10. The analog-to-digital conversion system recited in claim 7, wherein said first terminal functions as either an analog or digital data input channel when said control word is in said first state, and said second terminal functions as an analog data input channel when said control word is in said first state.

11. The analog-to-digital conversion system recited in claim 10, for use with at least one additional multiplexer circuit having a plurality of data input terminals, at least one address input port connectable to said first terminal, and a data output port connectable to said second terminal, wherein said sampling means is responsive to said plurality of conversion command words in one of said queues to sample analog signals on said plurality of multiplexer data input terminals.

12. An analog-to-digital conversion system for use with at least one multiplexer circuit having a plurality of data input terminals, at least one address input port, and at least one data output port, said conversion system comprising:
   (a) an analog-to-digital integrated circuit comprising:
      (i) a plurality of analog input terminals;
      (ii) means for reading a conversion sequence;
      (iii) sampling means responsive to said conversion sequence to sample, in turn, an analog signal on each of a plurality of corresponding analog input terminals;
      (iv) analog-to-digital converter means responsive to said sampling means for converting the sampled value of said analog signal into a digital value;
      (v) means responsive to said converter means for storing said digital value;
      (vi) a control register comprising a control field for holding a control word, said control word having at least a first state and a second state;
      (vii) a first terminal connectable to one of said address input ports of said multiplexer, said first terminal functioning as a data input channel when said control word is in said first state, and said first terminal functioning as an address output channel when said control word is in said second state; and (viii) a second terminal connectable to one of said data output ports of said multiplexer, said second terminal functioning as a data input channel when said control word is in said first state, and said second terminal functioning as a multiplexed data input channel when said control word is in said second state.

13. An analog-to-digital conversion system comprising:

(a) a multiplexer integrated circuit having a plurality of analog input terminals, at least one address input port, and at least one data output port;

(b) an analog-to-digital integrated circuit comprising:

(i) a plurality of input terminals, including at least two analog input terminals, said at least one multiplexer address input port and said at least one multiplexer data output port being coupled to at least one of said input terminals;

(ii) means for reading a plurality of conversion command words in the form of a queue defining a conversion sequence;

(iii) sampling means responsive to said plurality of conversion command words in said queue to sample, in turn, an analog signal on each of a plurality of corresponding analog input terminals;

(iv) analog-to-digital converter means responsive to said sampling means for converting the sampled value of each of said analog signals into a digital value;

(v) means responsive to said converter means for storing said digital value;

(vi) a control register comprising a control field for holding a control word, said control word having at least a first state and a second state;

and wherein said plurality of analog-to-digital input terminals comprises:

(vii) a first terminal, said first terminal functioning as a data input channel when said control word is in said first state, and said first terminal functioning as an address output channel when said control word is in said second state;

(viii) a second terminal, said second terminal functioning as a data input channel when said control word is in said first state, and said second terminal functioning as a multiplexed data input channel when said control word is in said second state;

and wherein said multiplexer at least one address input port is coupled to said first terminal, and said multiplexer at least one data output port is coupled to said second terminal.

14. The analog-to-digital conversion system recited in claim 13, wherein said sampling means is responsive to said plurality of conversion command words in said queue to take multiple samples of an analog signal on one of said plurality of analog input terminals.

15. The analog-to-digital conversion system recited in claim 13, wherein said sampling means is responsive to said plurality of conversion command words in said queue to take multiple samples of analog signals on said plurality of analog input terminals.

16. The analog-to-digital conversion system recited in claim 13, wherein said first terminal functions as either an analog or digital data input channel when said control word is in said first state, and said second terminal functions as an analog data input channel when said control word is in said first state.

17. The analog-to-digital conversion system recited in claim 13, further comprising at least one additional multiplexer integrated circuit having a plurality of data input terminals, at least one address input port coupled to said first terminal, and at least one data output port coupled to said second terminal, wherein said sampling means is responsive to said plurality of conversion command words in one of said queues to sample analog signals on said plurality of multiplexer data input terminals.

18. An analog-to-digital conversion system comprising:

(a) a multiplexer integrated circuit having a plurality of analog input terminals, at least one address input port, and at least one data output port;

(b) an analog-to-digital integrated circuit comprising:

(i) a plurality of input terminals including at least two analog input terminals, said multiplexer address input port and data output port being coupled to at least one of said input terminals;

(ii) means for reading a conversion sequence;

(iii) sampling means responsive to said conversion sequence to sample, in turn, an analog signal on each of a plurality of corresponding analog input terminals;

(iv) analog-to-digital converter means responsive to said sampling means for converting the sampled value of each of said analog signals into a digital value;

(v) means responsive to said converter means for storing said digital value;

(vi) a control register comprising a control field for holding a control word, said control word having at least a first state and a second state;

(vii) a first terminal, said first terminal functioning as a data input channel when said control word is in said first state, and said first terminal functioning as an address output channel when said control word is in said second state;

(viii) a second terminal, said second terminal functioning as a data input channel when said control word is in said first state, and said second terminal functioning as a multiplexed data input channel when said control word is in said second state;

and wherein said multiplexer integrated circuit has at least one of said address input ports coupled to said first terminal, and at least one of said data output ports coupled to said second terminal.

19. An analog-to-digital conversion system comprising:

an analog-to-digital converter having an input for receiving an analog signal, an output for providing a digital signal proportional to the analog signal, a control parameter input and a conversion initiation control input;

a plurality of analog signal input terminals;

a multiplexer having a plurality of input terminals, each of which is coupled to one of the plurality of analog signal input terminals and having an output coupled to the input of the analog-to-digital converter and having a control input;

memory means coupled to the output of the analog-to-digital converter for storing the digital signal and for storing a plurality of conversion command words;

host interface means coupled to the memory means for coupling the analog-to-digital conversion system to an external host data processor; and control logic means coupled to the memory means, to the control parameter and conversion initiation control inputs of the analog-to-digital converter and to the control input of the multiplexer for detecting occurrence of a predetermined initiation condition and, in response to said occurrence, for:

i) selecting one of the plurality of conversion command words;

ii) providing a control parameter value contained in the selected conversion command word to the control parameter input of the analog-to-digital converter;

iii) providing a channel selection value contained in the selected conversion command word to the control input of the multiplexer;

iv) providing a conversion initiation control signal to the conversion initiation input of the analog-to-digital converter;

v) causing the digital signal to be stored in the memory means;

vi) repeating steps i) through iv) until an end of sequence condition is detected; and vii) halting when the end of sequence condition is detected.

20. An analog-to-digital conversion system according to claim 19 further comprising:

a plurality of reference signal input terminals coupled to the multiplexer.

21. An analog-to-digital conversion system according to claim 19 wherein:

the channel selection value encodes the end of sequence condition.

22. An analog-to-digital conversion system according to claim 19 further comprising:

a control register coupled to the host interface means and to the control logic means;

and wherein the control logic means further comprises:

external multiplexer control means responsive to a predetermined state of the control register for providing an external multiplexer control output signal by means of one of the analog signal input terminals.

* * * * *

UNITED STATES PATENT AND TRADEMARK OFFICE
CERTIFICATE OF CORRECTION

PATENT NO. : 5,166,685

DATED : November 24, 1992

INVENTOR(S) : Jules D. Campbell, Jr. et al.

It is certified that error appears in the above-identified patent and that said Letters Patent is hereby corrected as shown below:

Column 28, line 3, before "comprising", insert --register--.

Signed and Sealed this

Twenty-second Day of March, 1994

Attest:

BRUCE LEHMAN

Attesting Officer        Commissioner of Patents and Trademarks